United States Patent
Pisarenco et al.

(10) Patent No.: US 11,536,654 B2
(45) Date of Patent: Dec. 27, 2022

(54) SCATTEROMETER AND METHOD OF SCATTEROMETRY USING ACOUSTIC RADIATION

(71) Applicant: ASML Netherlands B.V., Veldhoven (NL)

(72) Inventors: Maxim Pisarenco, Son en Breugel (NL); Nitesh Pandey, Eindhoven (NL); Alessandro Polo, Arendonk (BE)

(73) Assignee: ASML Netherlands B.V., Veldhoven (NL)

( * ) Notice: Subject to any disclaimer, the term of this patent is extended or adjusted under 35 U.S.C. 154(b) by 122 days.

(21) Appl. No.: 17/092,397

(22) Filed: Nov. 9, 2020

(65) Prior Publication Data

US 2021/0055215 A1    Feb. 25, 2021

Related U.S. Application Data

(63) Continuation of application No. 16/162,009, filed on Oct. 16, 2018, now Pat. No. 10,845,304.

(30) Foreign Application Priority Data

Oct. 17, 2017  (EP) .................................. 17196893

(51) Int. Cl.
*G01N 21/95*  (2006.01)
*G01N 29/06*  (2006.01)
(Continued)

(52) U.S. Cl.
CPC ..... *G01N 21/4788* (2013.01); *G01N 21/9501* (2013.01); *G01N 21/956* (2013.01);
(Continued)

(58) Field of Classification Search
CPC ............. G03F 7/7085; G01N 29/4472; G01N 2291/102; G01N 29/069; G01N 2291/044;
(Continued)

(56) References Cited

U.S. PATENT DOCUMENTS 6,818,360 B1   11/2004 Phan et al.
6,917,419 B2   7/2005 Fielden et al.
(Continued)

FOREIGN PATENT DOCUMENTS

CN   106662823 A   5/2017
EP   1 628 164 A   2/2006
(Continued)

OTHER PUBLICATIONS

International Search Report and Written Opinion of the International Searching Authority directed to related International Patent Application No. PCT/EP2018/077579, dated Jan. 28, 2019; 12 pages.
(Continued)

*Primary Examiner* — Brandi N Hopkins
(74) *Attorney, Agent, or Firm* — Sterne, Kessler, Goldstein & Fox P.L.L.C.

(57) ABSTRACT

An acoustic scatterometer has an acoustic source operable to project acoustic radiation onto a periodic structure and formed on a substrate. An acoustic detector is operable to detect the −1st acoustic diffraction order diffracted by the periodic structure and while discriminating from specular reflection (0th order). Another acoustic detector is operable to detect the +1st acoustic diffraction order diffracted by the periodic structure, again while discriminating from the specular reflection (0th order). The acoustic source and acoustic detector may be piezo transducers. The angle of incidence of the projected acoustic radiation and location of (Continued)

the detectors and are arranged with respect to the periodic structure and such that the detection of the −1st and +1st acoustic diffraction orders and discriminates from the 0th order specular reflection.

20 Claims, 11 Drawing Sheets

(51) Int. Cl.
G03F 7/20 (2006.01)
G01N 21/956 (2006.01)
G01N 21/47 (2006.01)
G01N 29/44 (2006.01)
(52) U.S. Cl.
CPC ....... *G01N 29/069* (2013.01); *G01N 29/4472* (2013.01); *G03F 7/7015* (2013.01); *G03F 7/7085* (2013.01); *G03F 7/70341* (2013.01); *G03F 7/70608* (2013.01); *G03F 7/70625* (2013.01); *G03F 7/70633* (2013.01); *G03F 7/70641* (2013.01); *G01N 2291/044* (2013.01); *G01N 2291/102* (2013.01)
(58) Field of Classification Search
CPC .............. G01N 29/11; G01N 29/04; G01N 2291/0289; G01N 2291/02827; G01N 2291/052; G01N 2291/105; G01N 2291/2623; G01N 2291/056
See application file for complete search history.

(56) References Cited

U.S. PATENT DOCUMENTS

| | | | |
|---|---|---|---|
| 6,917,433 B2 | 7/2005 | Levy et al. | |
| 6,919,957 B2 | 7/2005 | Nikoonahad et al. | |
| 6,946,394 B2 | 9/2005 | Fielden et al. | |
| 6,950,196 B2 | 9/2005 | Fielden et al. | |
| 6,952,253 B2 | 10/2005 | Lof et al. | |
| 7,701,577 B2 | 4/2010 | Straaijer et al. | |
| 7,791,724 B2 | 9/2010 | Den Boef et al. | |
| 8,115,926 B2 | 2/2012 | Straaijer | |
| 8,553,227 B2 | 10/2013 | Jordanoska | |
| 8,681,312 B2 | 3/2014 | Staaijer | |
| 8,692,994 B2 | 4/2014 | Straaijer | |
| 8,792,096 B2 | 7/2014 | Straaijer | |
| 8,797,554 B2 | 8/2014 | Straaijer | |
| 8,823,922 B2 | 9/2014 | Den Boef | |
| 9,952,517 B2 | 4/2018 | Verma et al. | |
| 10,845,304 B2 | 11/2020 | Pisarenco et al. | |
| 2008/0239265 A1* | 10/2008 | Den Boef | G03F 7/70625 250/580 |
| 2010/0007863 A1* | 1/2010 | Jordanoska | G03F 7/70625 356/326 |
| 2010/0328655 A1 | 12/2010 | Den Boef | |
| 2011/0026032 A1 | 2/2011 | Den Boef et al. | |
| 2011/0027704 A1 | 2/2011 | Cramer et al. | |
| 2011/0102753 A1 | 5/2011 | Van De Kerkhof et al. | |
| 2011/0249244 A1 | 10/2011 | Leewis et al. | |
| 2012/0044470 A1 | 2/2012 | Smilde et al. | |
| 2012/0314194 A1* | 12/2012 | Onvlee | G03F 7/70275 355/53 |
| 2013/0059240 A1 | 3/2013 | Van Der Schaar et al. | |
| 2013/0162996 A1 | 6/2013 | Straaijer et al. | |
| 2014/0123761 A1 | 5/2014 | Turner et al. | |
| 2016/0161863 A1 | 6/2016 | Den Boef et al. | |
| 2016/0370717 A1 | 12/2016 | Den Boef et al. | |
| 2017/0102623 A1 | 4/2017 | Pisarenco | |
| 2019/0113452 A1* | 4/2019 | Pisarenco | G03F 7/70625 |

FOREIGN PATENT DOCUMENTS

| | | |
|---|---|---|
| JP | 2005-241611 A | 9/2005 |
| WO | WO 99/49504 A1 | 9/1999 |

OTHER PUBLICATIONS

International Preliminary Report on Patentability directed to International Patent Application No. PCT/EP2018/077579, dated Apr. 21, 2020; 6 pages.
Non-Final Office Action directed to U.S. Appl. No. 16/162,009, dated Oct. 1, 2019; 9 pages.
Final Office Action directed to U.S. Appl. No. 16/162,009, dated Mar. 24, 2020; 10 pages.
Notice of Allowance directed to U.S. Appl. No. 16/162,009, dated Jul. 22, 2020; 7 pages.

* cited by examiner

SCATTEROMETER AND METHOD OF SCATTEROMETRY USING ACOUSTIC RADIATION

CROSS-REFERENCE TO RELATED APPLICATIONS

This application is a continuation of U.S. patent application Ser. No. 16/162,009, filed Oct. 16, 2018, which claims priority of European Application No. 17196893, filed on Oct. 17, 2017, and are incorporated herein in their entirety by reference.

FIELD

The present disclosure relates to a scatterometer and method of scatterometry usable, for example, in the manufacture of devices by lithographic techniques.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-k1 lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and k1 is an empirical resolution factor. In general, the smaller k1 the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of optical scatterometers have been developed for use in the lithographic field. These devices direct a beam of electromagnetic radiation onto a target and measure one or more properties of the scattered electromagnetic radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

There are limitations in the performance of optical scatterometers. For example, for controlling the manufacture of semiconductor devices such as 3D XPoint non-volatile memory and 3D NAND, it is difficult or impossible to measure overlay through opaque mask layers that separate the overlaid upper pattern from the lower pattern. The opaque layers may be metal layers of several 10s of nm in thickness and carbon hardmasks of several μm in thickness. Metrology using optical scatterometers is challenging as the masks employed are barely transmissive for electromagnetic radiation, with the extreme case being metal masks, where electromagnetic radiation is absorbed and does not go through the metal mask at all.

SUMMARY

It is desirable to have an alternative to optical scatterometry, for example to determine substrate properties such as overlay errors when optical scatterometry is not practical because of optically opaque or attenuating materials being present on the substrate.

According to a first aspect of the present invention, there is provided a scatterometer comprising:

an acoustic source operable to project acoustic radiation onto a periodic structure formed on a substrate; and an acoustic detector operable to detect an acoustic diffraction order diffracted by the periodic structure while discriminating from specular reflection, wherein the scatterometer is operable to determine a property of the substrate based on the detected acoustic diffraction order.

According to a second aspect of the present invention, there is provided method of scatterometry comprising:

projecting acoustic radiation onto a periodic structure formed on a substrate;

detecting an acoustic diffraction order diffracted by the periodic structure while discriminating from specular reflection; and determining a property of the substrate based on the detected acoustic diffraction order.

BRIEF DESCRIPTION OF THE DRAWINGS

Embodiments of the invention will now be described, by way of example only, with reference to the accompanying schematic drawings, in which.

DETAILED DESCRIPTION

Figure 1:
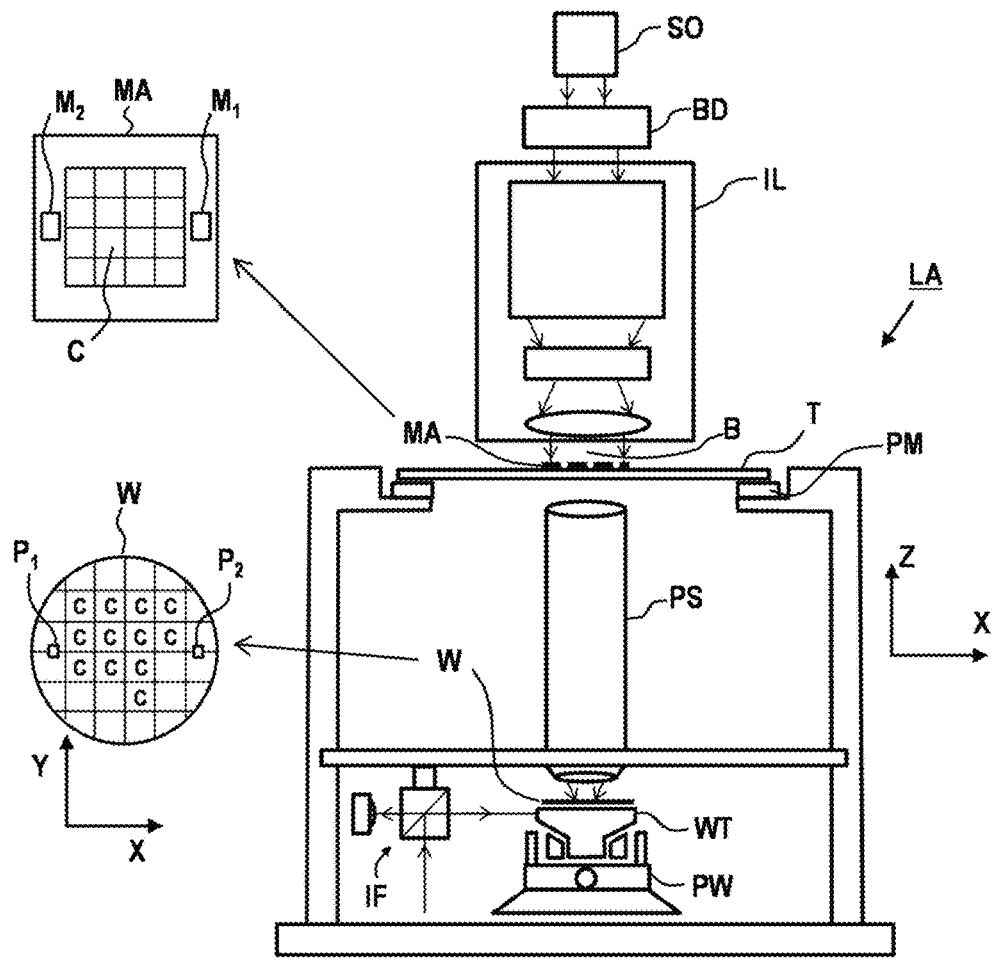
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition an electromagnetic radiation beam B (e.g., UV radiation, DUV radiation or EUV radiation), a support structure (e.g., a mask table) T constructed to support a patterning device (e.g., a mask) MA and connected to a first positioner PM configured to accurately position the patterning device MA in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illuminator IL receives a radiation beam from a radiation source SO, e.g. via a beam delivery system BD. The illumination system IL may include various types of optical components, such as refractive, reflective, magnetic, electromagnetic, electrostatic, or other types of optical components, or any combination thereof, for directing, shaping, or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate may be covered by a liquid having a relatively high refractive index, e.g., water, so as to fill a space between the projection system and the substrate—which is also referred to as immersion lithography. More information on immersion techniques is given in U.S. Pat. No. 6,952,253 and in PCT publication No. WO99-49504, which are incorporated herein by reference.

The lithographic apparatus LA may also be of a type having two (dual stage) or more substrate tables WT and, for example, two or more support structure T (not shown). In such "multiple stage" machines the additional tables/structures may be used in parallel, or preparatory steps may be carried out on one or more tables while one or more other tables are being used for exposing the design layout of the patterning device MA onto the substrate W.

In operation, the radiation beam B is incident on the patterning device (e.g., mask MA), which is held on the support structure (e.g., mask table T), and is patterned by the patterning device MA. Having traversed the mask MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and possibly another position sensor (which is not explicitly depicted in FIG. 1) may be used to accurately position the mask MA with respect to the path of the radiation beam B. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Figure 2:
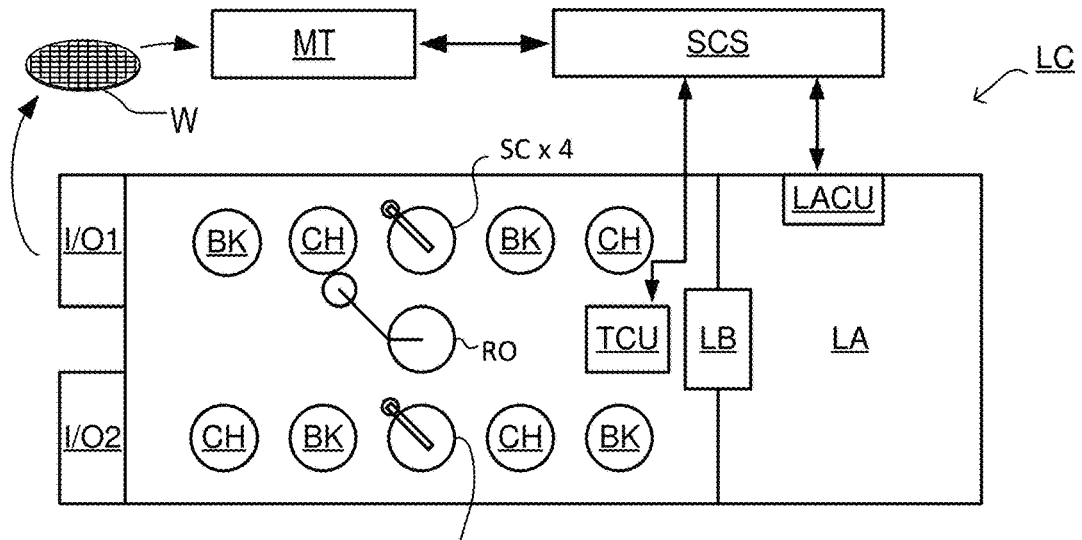
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, one or more inspection tool MT may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
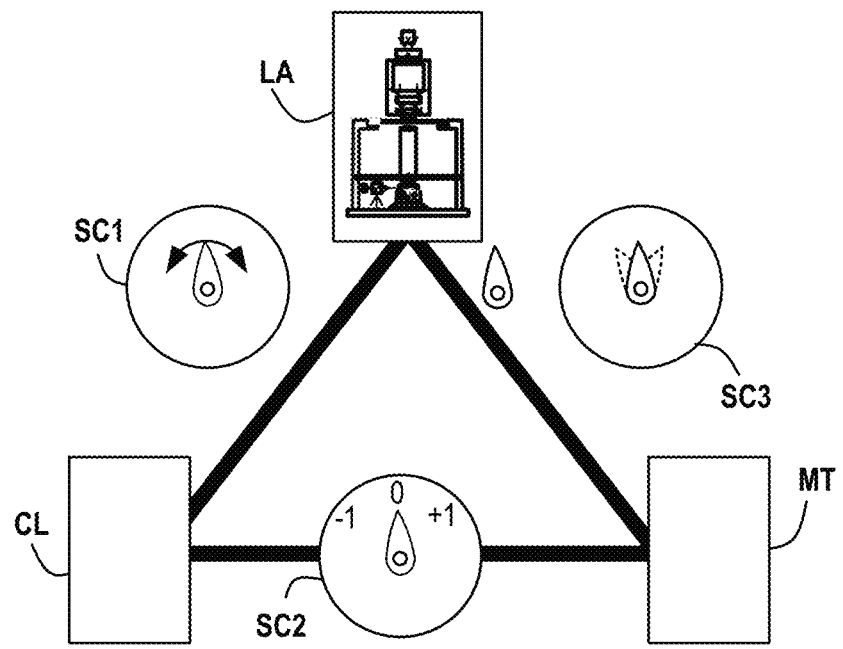
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of optical scatterometer metrology tools MT. Optical scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray, visible light to near-IR wavelength range.

The scatterometer MT may be an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

Alternatively, the scatterometer MT may be a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

Alternatively, the scatterometer MT may be an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033,135, 13/533,110 and 13/891,410 incorporated herein by reference in their entirety.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and US patent application US 2016-0370717, incorporated herein by reference in their entirety.

In embodiments of the present invention, an acoustic scatterometer may be used to replace the optical scatterometer and its function in the lithographic cell of FIG. 2 or control environment of FIG. 3.

In the following disclosure, the term "radiation" is used to encompass all types of acoustic radiation, including ultrasonic radiation.

In embodiments of the present invention, overlay between overlapping gratings is measured as an intensity asymmetry between diffracted acoustic orders. Embodiments of the present invention may be used to implement diffraction-based acoustic metrology, wherein periodic structure asymmetry or overlay is determined from the asymmetry between acoustic diffracted orders.

The all-acoustic overlay measurement may be performed by detecting the scattered acoustic pressure distribution when two gratings or structures placed on top of each other are excited by an acoustic wave. Since acoustic waves also obey the wave equation (Section 4, below), similar diffraction phenomena can be observed. The diffracted acoustic wave will also have an asymmetric distribution in the higher orders, should an overlay between gratings be present. This can be detected by single transducers or by an array of 2D (two-dimensional) transducers. Today's technology allows fabrication of 2D acoustic detectors in the tens of micron range.

Besides intensity data, phase data can be included in the measurements. In acoustics one can detect the actual phase of the sound waves if the frequencies are in the MHz-GHz range. For frequencies above GHz where digital acquisition is no longer possible, phase retrieval is required.

Figure 4:
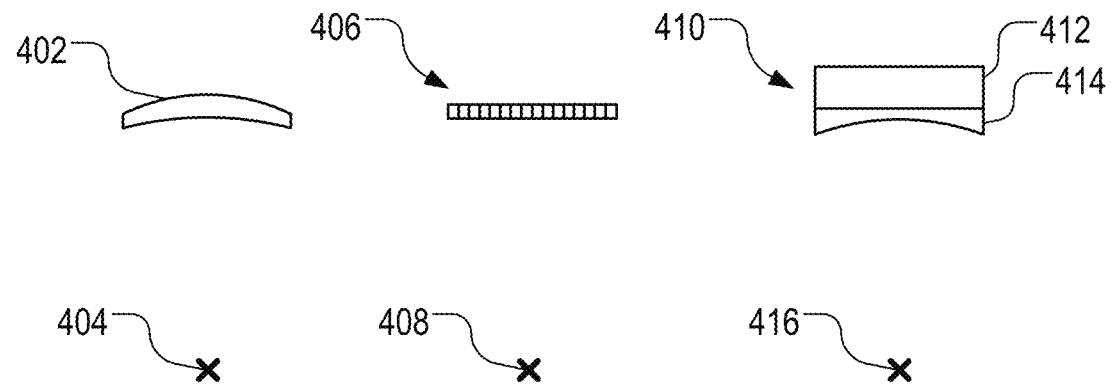
FIG. 4 depicts, in schematic form, different configurations of acoustic transducers that may be used in embodiments of the present invention.

FIG. 4 depicts, in schematic form, different configurations of acoustic transducers that may be used in embodiments of the present invention. A curved piezo element 402 is shaped to produce a focus of acoustic radiation 404. A phased-array piezo element 406 uses electronic delays between activation of discrete sub-elements to achieve electronic focusing at and detection from a focal point 408. An acoustic lens 410 has a piezo element 412 and a shaped component 414 to achieve a focus 416.

Acoustic microscopy uses very high or ultra-high-frequency ultrasound to image structures. Ultrasound is defined as a sound having a frequency above 20 kHz. Acoustic microscopes may operate with ultrasound ranging from ranging from 5 MHz to beyond 400 MHz, and as high as 2 to 5 GHz. Acoustic microscopes are non-destructive. The acoustic radiation penetrates solid materials and the reflection and transmission properties of the ultrasonic radiation are used to detect cracks, voids, delamination and other defects within solid samples.

Ultrasound at low frequencies penetrates deeper into materials compared to ultrasound at high frequencies. Semiconductor devices are typically fabricated in layers on a substrate, therefore high-frequency ultrasound, which does not penetrate deeply, is suitable for imaging defects in semiconductor devices. For measurement with embodiments of the present invention, periodic structures such as overlaid gratings may be very close to and at the surface of the substrate. Therefore the acoustic radiation used in accordance with such embodiments of the present invention may use ultra-high frequency ultrasound that does not penetrate very deeply.

Figure 5:
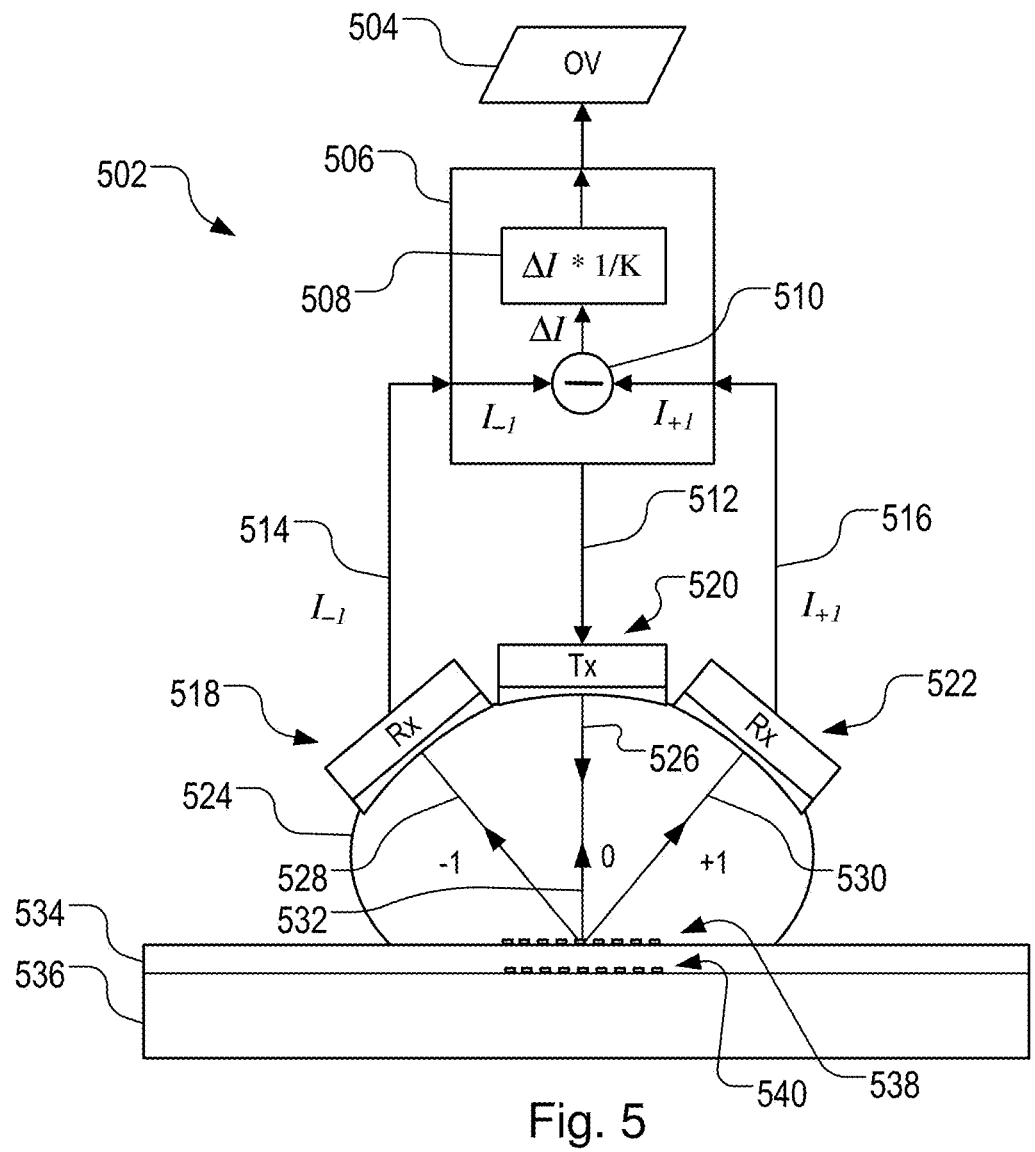
FIG. 5 depicts, in schematic form, a scatterometer in accordance with an embodiment of the present invention.

FIG. 5 depicts an acoustic scatterometer 502. The scatterometer has an acoustic source 520 operable to project acoustic radiation 526 onto a periodic structure 538 and 540 formed on a substrate 536. The acoustic source is controlled by a processing unit 506, which outputs a control signal 512 to control acoustic projection by the acoustic source 520. An acoustic detector 518 is operable to detect the −1st acoustic diffraction order 528 diffracted by the periodic structure 538 and 540 while discriminating from specular reflection (0th order 532). Another acoustic detector 522 is operable to detect the +1st acoustic diffraction order 530 diffracted by the periodic structure, again while discriminating from the specular reflection (0th order 532). The acoustic source and acoustic detector may be piezo transducers as described with reference to FIG. 4. In the Figures, acoustic sources are labelled "Tx" as in "transmit" and detectors are labelled "Rx" as in "receive".

The angle of incidence of the projected acoustic radiation 526 and location of the detectors 518 and 522 are arranged with respect to the periodic structure 538 and 540 such that the detection of the −1st and +1st acoustic diffraction orders 528 and 530 discriminates from the 0th order specular reflection 532. In the examples described herein, the periodic structure has a direction of periodicity perpendicular to the lines of the grating, i.e. from left to right in the cross-section depicted in FIG. 5. The locations of the detectors are distributed along that direction, i.e. from left to right.

A couplant system provides a couplant 524 to facilitate transmission of the acoustic radiation between the acoustic source 520 and the acoustic detectors 518, 522 via the periodic structure 528 and 530. A couplant system similar to one used in known immersion techniques, as mentioned above, may be used. A suitable couplant is distilled water.

The scatterometer 502 is operable to determine a property (in this example overlay error, OV) 504 of the substrate based on the detected acoustic diffraction orders 528, 530. The scatterometer 502 is operable to determine the property 504 of the substrate based on at least one of amplitude, phase and direction of one or more of the detected acoustic diffraction orders 528, 530. The property of the substrate may comprises a physical property of the periodic structure, such as CD or overlay.

In this example, the scatterometer 502 is operable to determine a structural asymmetry 504 of the periodic structure 538 and 540 based on asymmetry of corresponding opposite detected (−1st 528 and +1st 530) acoustic diffraction orders diffracted by the periodic structure 538 and 540. The acoustic detector 518 outputs an intensity signal $I_{−1}$ 514 which is a measure of the amplitude of the −1st acoustic diffraction order 514. The acoustic detector 522 outputs an intensity signal $I_{+1}$ 516 which is a measure of the amplitude of the +1st acoustic diffraction order 530. In other examples, the detectors may be configured to detect phase or direction of the diffracted acoustic orders.

Although overlay may be extracted from the asymmetry between the corresponding opposite acoustic diffraction orders, overlay is just one of the parameters which can affect the structural asymmetry. Various features of a grating or differences between one or more gratings may result in an acoustic diffraction order asymmetry. The features or differences may be physical shape differences such as sidewall angle, floor tilt or top tilt. The features or differences may be process-induced by variation of process parameters related to pitch, focus, or dose for example. Measurement of these process parameters through the asymmetry of the acoustic diffraction orders allows control of the process to mitigate the process-induced variation. The grating or gratings may be one-dimensional (e.g. a set of parallel lines) or two-dimensional (e.g. an array of dots).

Although in the examples described herein, with reference to FIGS. 5 and 12 to 18, opposite acoustic diffraction orders are first orders, other orders may be used, for example the second or third order. Orders may be combined together, for example, the opposite diffraction orders may be −1st and −2nd on the one hand and +1st and +2nd orders on the other hand.

The periodic structure is now described in more detail. As depicted in cross-section in FIG. 5, it has a grating 538 overlaid over another grating 540, separated by a layer 534. The layer 534 may be opaque to optical radiation, but transmits acoustic radiation.

The output intensity signals $I_{−1}$ 514 and $I_{+1}$ 516 are received by a processing unit 506. The signals are subtracted by a subtraction block 510. A post-processing block 508 multiplies the subtracted delta $(I_{−1}−I_{+1})$ by 1/K to obtain the overlay error OV 504. Although in this example a digital processing unit is used, analogue circuitry may be used to determine the overlay and/or other property of the substrate.

K may be determined using the following methods known from optical metrology.

A model of the structure may be used. For example, a "nominal model", which in essence is a theoretical best guess of what the target or device structure is, may be used. This theoretical description may be determined from a full reconstruction of the structure using Maxwell's equation, or from SEM measurements. The response of the structure for the particular wavelength or other illumination conditions is simulated, and K is determined. In this way, the proportionality constant K can be determined by computing the overlay sensitivity (K=dI/dOV) for the nominal stack. Here 'nominal stack' represents the best available knowledge about the actual stack of layers in the semiconductor process that are used to fabricate the structure.

Another option is to determine K experimentally via set/get experiments. Various induced overlay values are fabricated. A multitude of targets with programmed overlays are printed (set wafers) and overlay sensitivity K is measured on the wafers (intensity variation as a function of overlay).

Again as known from optical overlay metrology, +/−d biased targets may be used to determine K, where d is a deliberate overlay offset. This leads to two equations where K and overlay OV are unknown, and asymmetry of intensity and d (bias) are known. K may be determined using these biased targets. One can also measure overlay OV directly without knowing K.

In the example of FIG. 5, the asymmetry of amplitude is used, by subtracting intensity signals from the acoustic detectors, as follows. In other embodiments, the acoustic direction may be detected or angular direction may be detected and used to determine the overlay and/or other property of the substrate. At this frequency range phase is still measurable with transducers. The acoustic direction can be deduced by a different propagation path which can be measured by comparing the phase of the incoming pulse with respect to the received echo pulse.

The alternatives (including various measured parameters, substrate properties and diffraction orders) discussed with reference FIG. 5 above also apply to the other examples described herein, with reference to FIGS. 12 to 18.

Figure 6:
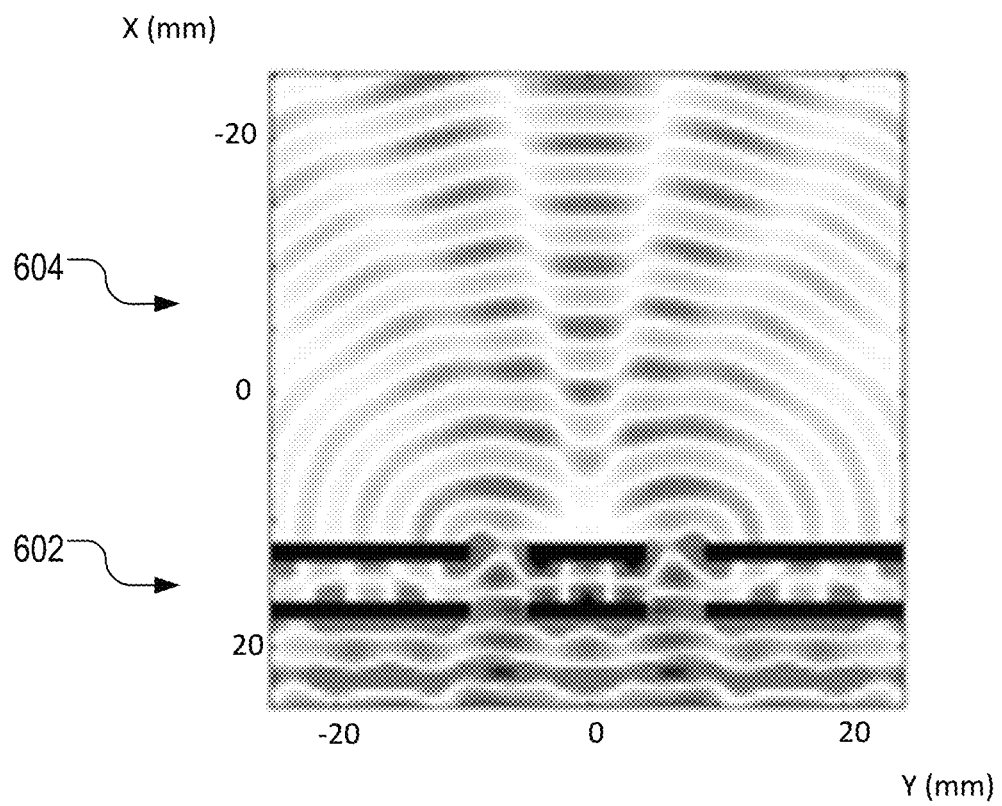
FIGS. 6 and 7 depict a simulated pressure distribution for a symmetrical structure and an asymmetrical structure respectively.
Figure 7:
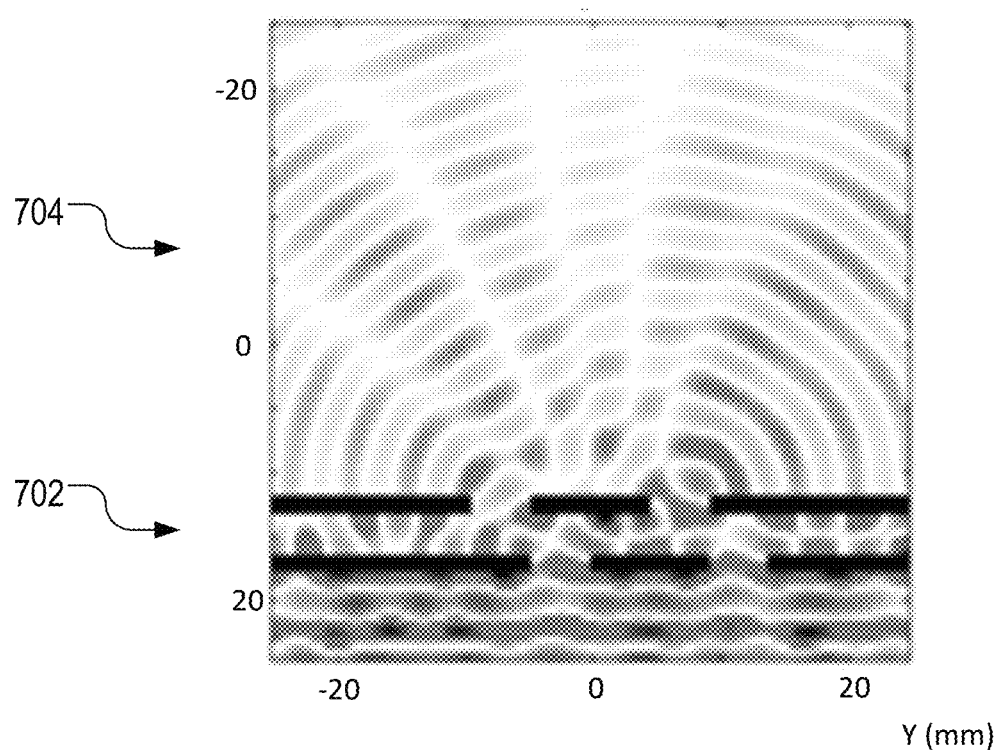

FIGS. 6 and 7 depict a simulated pressure distribution for a symmetrical structure 602 and an asymmetrical structure 702 respectively. These are the results for simulations for a realistic overlapping grating (using the K-wave toolbox for MATLAB™), wherein one can identify that an overlay error between the grating manifests itself as an asymmetry 704 in the diffracted acoustic wavefront, compared to the symmetrical case 604. These particular simulations are in transmission, but a similar effect is encountered in reflection as well.

1. Summary

In Sections 2 to 8 below, a more rigorous approach is described to quantify the asymmetry between diffracted acoustic orders in the case that overlay is present.

In summary, the findings are:

Overlay creates a diffracted orders asymmetry;

All diffracted acoustic waves from an overlapping grating will be characterized by two propagation velocities in the material, corresponding to compression and shear waves—thus we will have three interfering waves in the signal formation model for the first (or higher) orders. The overlay signal is shown to be proportional to the intensity difference between the diffracted orders;

The overlay sensitivity depends on two sine waves with different frequencies; and In order to estimate the sensitivity ΔI/OV an estimate of the reflection coefficient is needed. An alternative is to assume 10% reflection from each grating, making the overlay signal of the order of 1% ($1 \times 10^{−2}$) from the input signal.

2. Introduction

The purpose of the following is to derive an acoustic equivalent of the simplified signal formation model in optical diffraction-based overlay (DBO) measurements. Sections 3-5 contain a minimum of required theory in order to arrive at plane-wave solutions for an acoustic scattering problem. Section 6 describes the classical signal formation model for optical DBO measurements. Finally, Section 7 uses the theory from Sections 3-5 in order to derive a similar model for acoustics. The main difference with respect to the optics model is the presence in solid materials of two waves travelling with different velocities. The consequence is a slightly more complex 'swing curve' for the overlay sensitivity.

3. Acoustic Wave Equation

The acoustic wave equation in homogeneous materials is given by $$\rho \partial u = (\lambda + 2\mu)\nabla(\nabla \cdot u) - \mu \nabla \times (\nabla \times u). \tag{1}$$

where $u=[u_x, u_y, u_z]^T$ is the displacement vector, $\lambda>0$ is Lamé's first parameter, $\mu \geq 0$ is Lamé's second parameter (shear modulus), $\rho>0$ is the material density. The shear modulus is zero for fluids and positive for solid materials. Note that the above equation is derived under the assumption of homogeneous and isotropic materials.

4. Compression Waves and Shear Waves

The displacement u is often expressed in terms of the compression wave (or P-wave) scalar potential p and shear wave (or S-wave) vector potential s. The reason for this particular naming will become obvious in the next section. We will use the Helmholtz decomposition theorem $$u = u_p + u_s = \nabla p + \nabla \times s, \quad \nabla \cdot s = 0. \quad (2)$$

Note that $$\nabla \times \nabla p = 0, \quad (3)$$

$$\nabla \cdot (\nabla \times s) = 0. \quad (4)$$

Substitute (2) in (1), $$\rho \partial_{tt}(\nabla p + \nabla \times s) =$$
$$(\lambda + 2\mu)\nabla(\nabla \cdot (\nabla p + \nabla \times s)) - \mu \nabla \times (\nabla \times (\nabla p + \nabla \times s)) =$$
$$(\lambda + 2\mu)\nabla(\nabla \cdot \nabla p) - \mu \nabla \times (\nabla \times (\nabla \times s)) = (\lambda + 2\mu)\nabla(\nabla^2 p) + \mu \nabla^2(\nabla \times s)$$

where in the last step we have used the fact that $$\nabla \cdot (\nabla p) = \nabla^2 p, \quad (5)$$

$$-\nabla \times (\nabla \times \nabla \times s) = \nabla^2(\nabla \times s). \quad (6)$$

Grouping the terms together we obtain $$\nabla(\rho \partial_{tt} p - (\lambda + 2\mu)\nabla^2 p) = \nabla \times (\rho \partial_{tt} s - \mu \nabla^2 s).$$

The left-hand side is the gradient of a function of p, while the right-hand side is the curl of a function of s. As these sides are always equal for all t and x, they must be equal to some constant, which we can take as zero. Thus, the Helmholtz decomposition has enabled us to separate the elastodynamic equation of motion for an isotropic medium into two differential equations:

$$\rho \partial_{tt} p = (\lambda + 2\mu) \nabla^2 p, \quad (7)$$

$$\rho \partial_{tt} s = \mu \nabla^2 s. \quad (8)$$

These are wave equations with phase velocities. Note that the shear wave always travels slower than the compression wave, $c_s < c_p$. In the time-harmonic case, the wave equation becomes a Helmholtz equation. In optics, the Helmholtz equation is the starting point for the scalar theory of diffraction and other simplified models. This implies that similar models can be used in acoustics.

5. Plane Wave Solutions

In this section we will look at plane wave solutions of (7)-(8) in order to understand their properties. Given a wave equation $$\partial_{tt} w = \frac{1}{c^2} \nabla^2 w, \quad (9)$$

its general plane-wave solution is given by $$w(x,t) = r e^{i(k \cdot x \pm \omega t)}, \quad (10)$$

with $$|k| = \frac{2\pi}{\lambda} = \frac{\omega}{c}. \quad (11)$$

A plane-wave solution to the scalar wave equation for elastic media (7) is given by $$p(x,t) = a e^{i(k \cdot x \pm \omega t)}. \quad (12)$$

To obtain the displacement field due to the scalar potential p, we apply the gradient $$u_p = \nabla p = i a k e^{i(k \cdot x \pm \omega t)}. \quad (13)$$

This is a harmonic displacement disturbance with all displacement in the propagation direction k and is therefore referred to as compression wave or P-wave.

A plane-wave solution to the vector wave equation for elastic media (8) is given by $$s(x, t) = \begin{pmatrix} b_x \\ b_y \\ b_z \end{pmatrix} e^{i(k \cdot x \pm \omega t)}. \quad (14)$$

To obtain the displacement field due to the vector potential s, we apply the curl $$u_s = \nabla \times s = \begin{pmatrix} \partial_y s_z - \partial_z s_y \\ \partial_z s_x - \partial_x s_z \\ \partial_x s_y - \partial_y s_x \end{pmatrix} = i \begin{pmatrix} b_z k_y - b_y k_z \\ b_x k_z - b_z k_x \\ b_y k_x - b_x k_y \end{pmatrix} e^{i(k \cdot x \pm \omega t)}. \quad (15)$$

This is a harmonic displacement disturbance with all displacement perpendicular to the propagation direction k and is therefore referred to as shear wave or S-wave. To check the orthogonality with respect to k, take the inner product, $$-i \begin{pmatrix} b_z k_y - b_y k_z \\ b_x k_z - b_z k_x \\ b_y k_x - b_x k_y \end{pmatrix}^T \cdot \begin{pmatrix} k_x \\ k_y \\ k_z \end{pmatrix} = \quad (16)$$
$$b_z k_x k_y - b_y k_x k_z + b_x k_y k_z - b_z k_x k_y + b_y k_x k_z - b_x k_y k_z = 0.$$

6. Existing Signal Formation Model for Electromagnetic DBO

Figure 8:
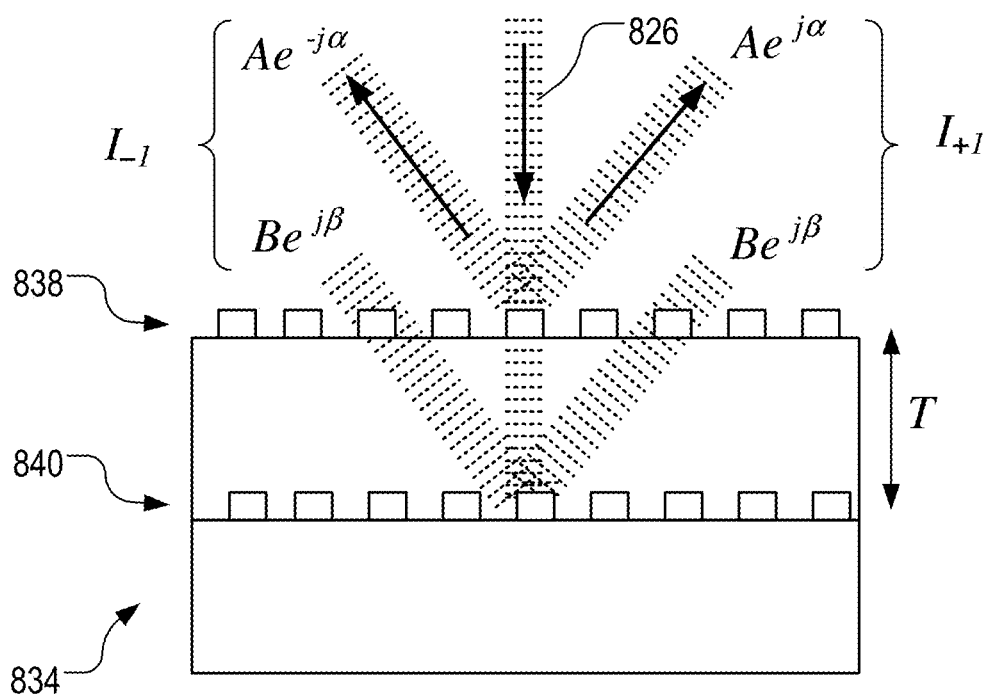
FIG. 8 depicts, in schematic form, a simplified model to explain signal formation for conventional optical diffraction-based overlay.

FIG. 8 depicts, in schematic form, a simplified model to explain signal formation for conventional optical diffraction-based overlay.

We consider the configuration from FIG. 8, where a plane-wave 826 illuminates an overlay target 834 comprising two 'overlayed' gratings 838 and 840 separated by a layer with thickness T. Under the assumption of single scattering (Born approximation, low optical contrast) the intensity of the first orders is given by $$I_{+1} = |Ae^{i\alpha} + Be^{i\beta}|^2 = (Ae^{i\alpha} + Be^{i\beta})(A^*e^{-i\alpha} + B^*e^{-i\beta}) =$$
$$|A|^2 + |B|^2 + BA^*e^{i(\beta-\alpha)} + AB^*e^{i(\alpha-\beta)}) =$$
$$|A|^2 + |B|^2 + 2Re(AB^*)\cos(\alpha - \beta).$$

$$I_{-1} = |Ae^{-i\alpha} + Be^{i\beta}|^2 = (Ae^{-i\alpha} + Be^{i\beta})(A^*e^{i\alpha} + B^*e^{-i\beta}) =$$
$$|A|^2 + |B|^2 + BA^*e^{i(\beta+\alpha)} + AB^*e^{-i(\alpha-\beta)}) =$$
$$|A|^2 + |B|^2 + 2Re(AB^*)\cos(\alpha + \beta).$$

The overlay is extracted from the intensity difference $$\Delta I =$$
$$I_{+1} - I_{-1} = 2Re(AB^*)(\cos(\alpha - \beta) - \cos(\alpha + \beta)) = 4Re(AB^*)\sin(\alpha)\sin(\beta).$$

Substituting the values for α,β from FIG. 8, $$\alpha = 2\pi \frac{OV}{P}, \tag{17}$$

$$\beta \approx 4\pi \frac{T}{\lambda}, \tag{18}$$

yields $$\Delta I = 4Re(AB^*)\sin\left(4\pi\frac{T}{\lambda}\right)\sin\left(2\pi\frac{OV}{P}\right) \approx 8Re(AB^*)\frac{\pi}{P}\sin\left(4\pi\frac{T}{\lambda}\right)OV.$$

The overlay sensitivity is then given by $$K = \frac{\Delta I}{OV} \approx 8Re(AB^*)\frac{\pi}{P}\sin\left(4\pi\frac{T}{\lambda}\right).$$

Figure 9:
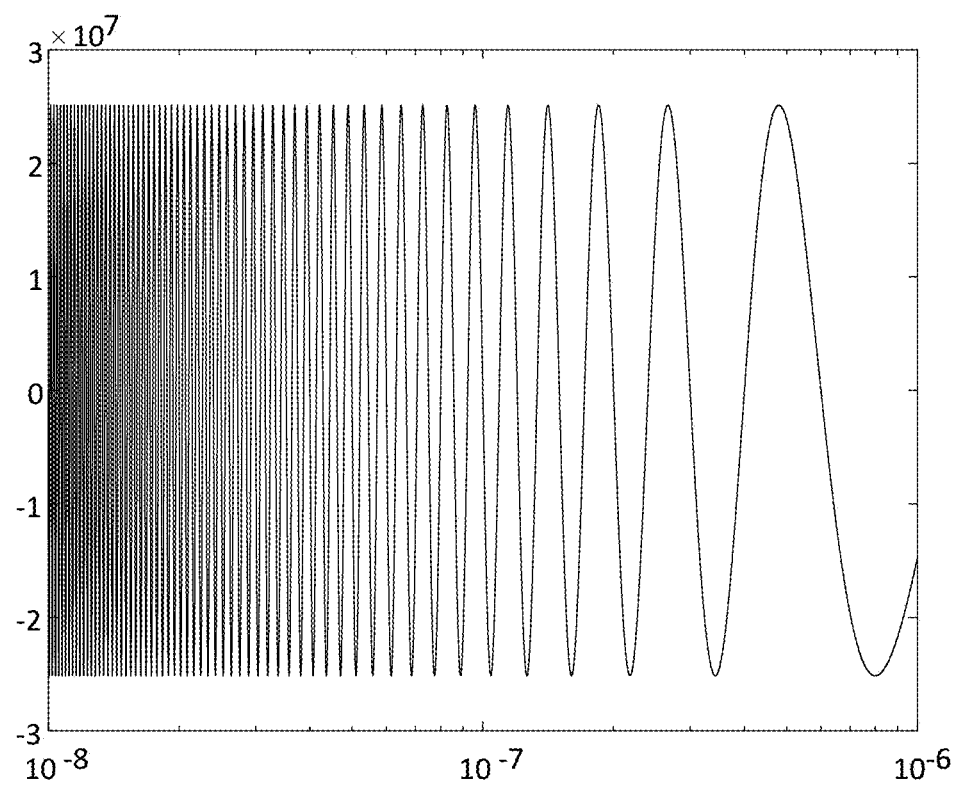
FIG. 9 is a graph of a conventional optical swing curve.

FIG. 9 is a graph of a conventional optical swing curve. FIG. 9 shows a qualitative swing curve, where we assumed $$\Re_{[AB^*]} = 10^{-2}, \tag{19}$$

$$P = 1\mu m, \tag{20}$$

$$T = 0.2\mu m. \tag{21}$$

Note that it is customary to assume the reflection coefficients to be constant when plotting a qualitative swing curve. In reality these coefficients are wavelength-dependent and may have a significant impact on the final shape of the actual swing curve.

7. Proposed Signal Formation Model for an Acoustic DBO

Figure 10:
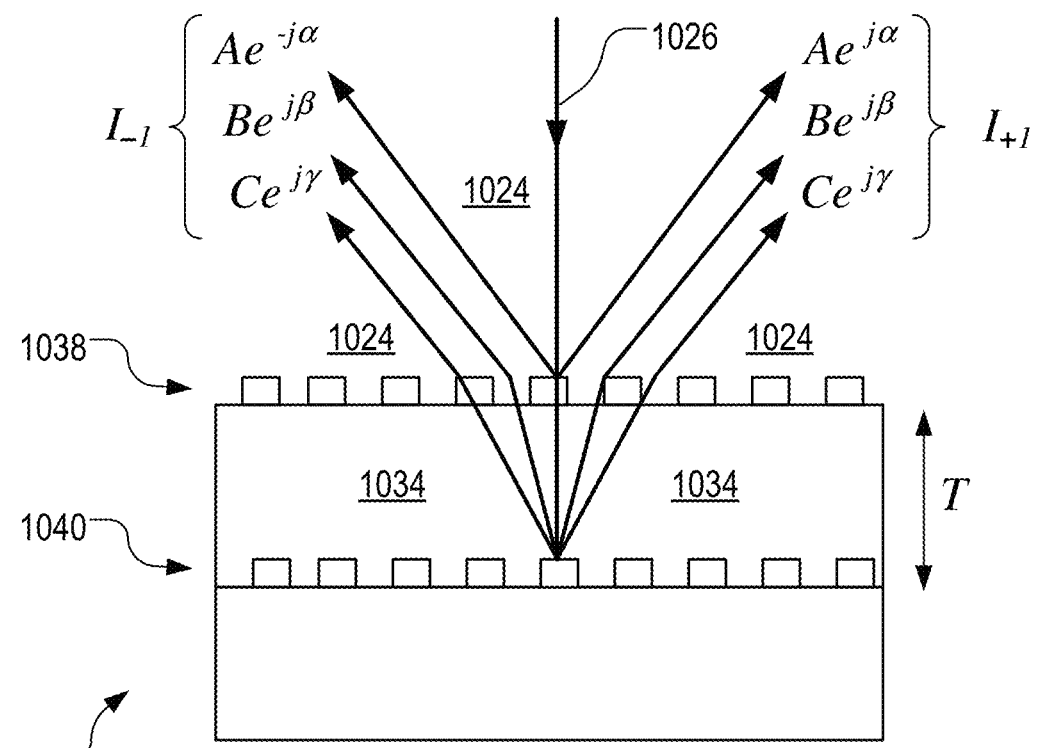
FIG. 10 depicts, in schematic form a simplified model to explain signal formation for acoustic diffraction-based overlay.

FIG. 10 depicts, in schematic form a simplified model to explain signal formation for acoustic diffraction-based overlay. We consider the configuration from FIG. 10, where an acoustic plane-wave 1026 impinges on an overlay target 1035 comprising two 'overlayed' gratings 1038 and 1040. The superstrate couplant material 1024 is fluid (gas or liquid) with μ=0 and the material between the gratings 1034 is a solid with μ>0 and thickness T. Note that the choice of materials is critical as μ>0 implies the presence of shear waves (next to compression waves). Thus, in the fluid-solid situation there are only compression waves in the fluid and both compression and shear waves in the solid. If the superstrate is replaced by a solid, or a very high-viscosity shear-wave couplant, a shear wave would need to be taken into account in the superstrate as well.

Under the assumption of single scattering (Born approximation, low acoustic contrast) the intensity of the first orders is given by $$I_{+1} = |Ae^{i\alpha} + Be^{i\beta} + Ce^{i\gamma}|^2$$
$$= (D + Ce^{i\gamma})(D^* + C^*e^{-i\gamma})$$
$$= |D|^2 + |C|^2 + DC^*e^{-i\gamma} + CD^*e^{i\gamma})$$
$$= |A|^2 + |B|^2 + 2Re(AB^*)\cos(\alpha - \beta) + |C|^2 +$$
$$AC^*e^{i(\alpha-\gamma)} + BC^*e^{i(\beta-\gamma)} + CA^*e^{-i(\alpha-\gamma)} + CB^*e^{-i(\beta-\gamma)}$$
$$= |A|^2 + |B|^2 + |C|^2 +$$
$$2Re(AB^*)\cos(\alpha - \beta) + 2Re(AC^*)\cos(\alpha - \gamma) +$$
$$2Re(BC^*)\cos(\beta - \gamma).$$

$$I_{-1} = |Ae^{-i\alpha} + Be^{i\beta} + Ce^{i\gamma}|^2$$
$$= (D + Ce^{i\gamma})(D^* + C^*e^{-i\gamma})$$
$$= |D|^2 + |C|^2 + DC^*e^{-i\gamma} + CD^*e^{i\gamma})$$
$$= |A|^2 + |B|^2 + 2Re(AB^*)\cos(\alpha + \beta) + |C|^2 +$$
$$AC^*e^{i(-\alpha-\gamma)} + BC^*e^{i(\beta-\gamma)} + CA^*e^{i(\alpha+\gamma)} + CB^*e^{i(-\beta+\gamma)}$$
$$= |A|^2 + |B|^2 + |C|^2 +$$
$$2Re(AB^*)\cos(\alpha + \beta) + 2Re(AC^*)\cos(\alpha + \gamma) +$$
$$2Re(BC^*)\cos(\beta - \gamma).$$

The overlay is extracted from the intensity difference $$\Delta I = I_{+1} - I_{-1}$$
$$= 2Re(AB^*)(\cos(\alpha - \beta) - \cos(\alpha + \beta)) +$$
$$2Re(AC^*)(\cos(\alpha - \gamma) - \cos(\alpha + \gamma))$$
$$= 4Re(AB^*)\sin(\alpha)\sin(\beta) - 4Re(AC^*)\sin(\alpha)\sin(\gamma)$$
$$= 4(Re(AB^*)\sin(\beta) - 4Re(AC^*)\sin(\gamma))\sin(\alpha).$$

Substituting the values for α,β, γ from FIG. 3, $$\alpha = 2\pi \frac{OV}{P}, \tag{22}$$

$$\beta \approx 4\pi \frac{T}{\lambda_p}, \tag{23}$$

$$\gamma \approx 4\pi \frac{T}{\lambda_s}, \tag{24}$$

yields $$\Delta I = 4\left(Re(AB^*)\sin\left(4\pi\frac{T}{\lambda_p}\right) - Re(AC^*)\sin\left(4\pi\frac{T}{\lambda_s}\right)\right)\sin\left(2\pi\frac{OV}{P}\right)$$
$$\approx \frac{8\pi}{P}\left(Re(AB^*)\sin\left(4\pi\frac{T}{\lambda_p}\right) - Re(AC^*)\sin\left(4\pi\frac{T}{\lambda_s}\right)\right)OV.$$

The overlay sensitivity is then given by $$K = \frac{\Delta I}{OV} \approx \frac{8\pi}{P}\left(Re(AB^*)\sin\left(4\pi\frac{T}{\lambda_p}\right) - Re(AC^*)\sin\left(4\pi\frac{T}{\lambda_s}\right)\right).$$

Interestingly, the 'swing curve' for acoustic overlay measurement consists of two sines with different frequencies.

8. Estimates

Table 1 lists the material properties relevant for acoustic waves. The first Lame coefficient $\lambda$ is obtained from Young's modulus $$\lambda = \frac{vE}{(1+v)(1-2v)},$$

or from the bulk modulus $$\lambda = K - \frac{2}{3}\mu.$$

TABLE 1

Material properties relevant for acoustic waves.

| | |
|---|---|
| Speed of sound in air: | c = 340 m/s |
| Material properties air: | ρ = 1225 kg/m³, λ = K = 101 kPa, μ = 0 |
| Material properties SiO₂: | ρ = 2203 kg/m³, λ = 16.09 GPa (E = 73.1 GPa, v = 0.17), μ = 31.2 GPa |
| Material properties Si: | ρ = 2329 kg/m³, λ = 93.46 GPa (E = 188 GPa, v = 0.28), μ = 80 GPa |

Assuming a wavelength in air $\Lambda = 0.1 \mu m$, the angular frequency is given by $$\omega = \frac{2\pi c}{\Lambda} = 9.32425 * 10^{10} s^{-1}.$$

Velocity of P and S waves in silicon $$c_{Si,p} = \sqrt{\frac{\lambda + 2\mu}{\rho}} = 8288.49 \text{ m/s}, \quad (25)$$

$$c_{Si,s} = \sqrt{\frac{\mu}{\rho}} = 5860.85 \text{ m/s}. \quad (26)$$

Wavelength of P and S waves in silicon $$\Lambda_{Si,P} = \frac{2\pi c_{Si,P}}{\omega} = 0.56 \mu m, \quad (27)$$

$$\Lambda_{Si,S} = \frac{2\pi c_{Si,S}}{\omega} = 0.39 \mu m. \quad (28)$$

Figure 11:
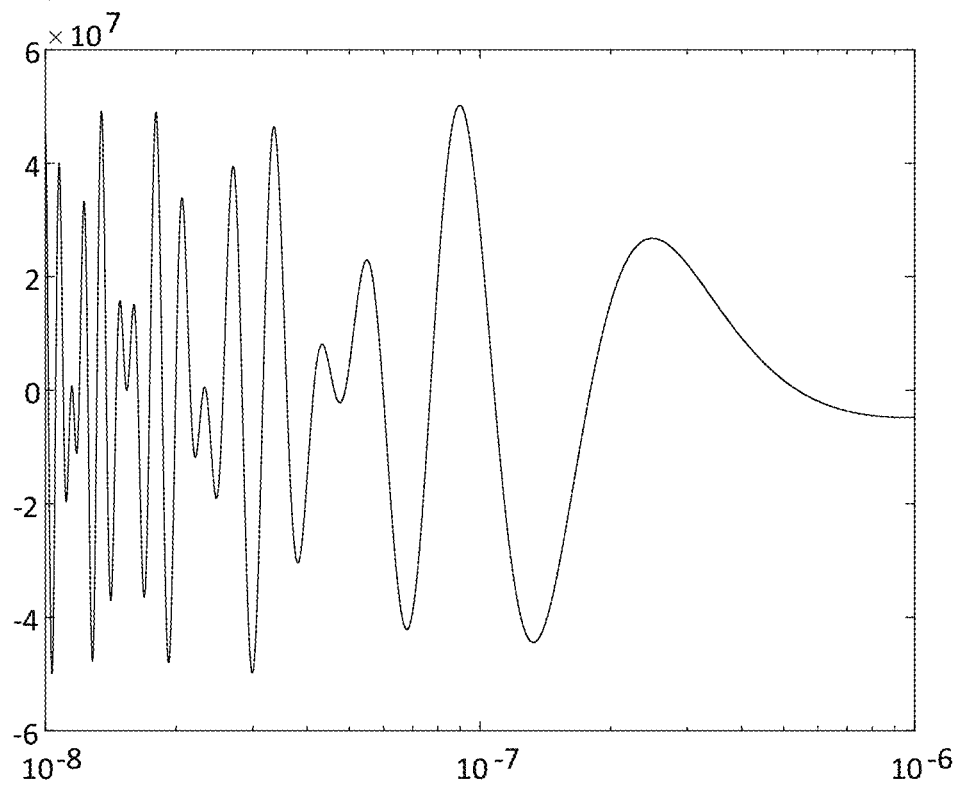
FIG. 11 is a graph of an acoustic swing curve.

FIG. 11 is a graph of an acoustic swing curve. FIG. 11 shows a qualitative swing curve, where we assumed $\mathfrak{R}_{[AB^*]} = 10^{-2}$, (29)

$\mathfrak{R}_{[AC]} = 10^{-2}$, (30)

$P = 1 \mu m$, (31)

$T = 0.2 \mu m$. (32)

As for the optical case, we assumed the reflection coefficients to be constant when plotting a qualitative acoustic swing curve. In reality these coefficients are wavelength-dependent and may have a significant impact on the final shape of the actual swing curve.

The modulus of the overlay sensitivity can be estimated for a best case scenario as follows $$|K| = \left|\frac{\Delta I}{OV}\right| \approx \frac{8\pi}{P}\left|Re(AB^*)\sin\left(4\pi\frac{T}{\lambda_p}\right) - Re(AC^*)\sin\left(4\pi\frac{T}{\lambda_s}\right)\right| \leq$$

$$\frac{8\pi}{P}(|Re(AB^*)| + |Re(AC^*)|).$$

The values A, B, C can be determined with a rigorous acoustic model.

Figure 12:
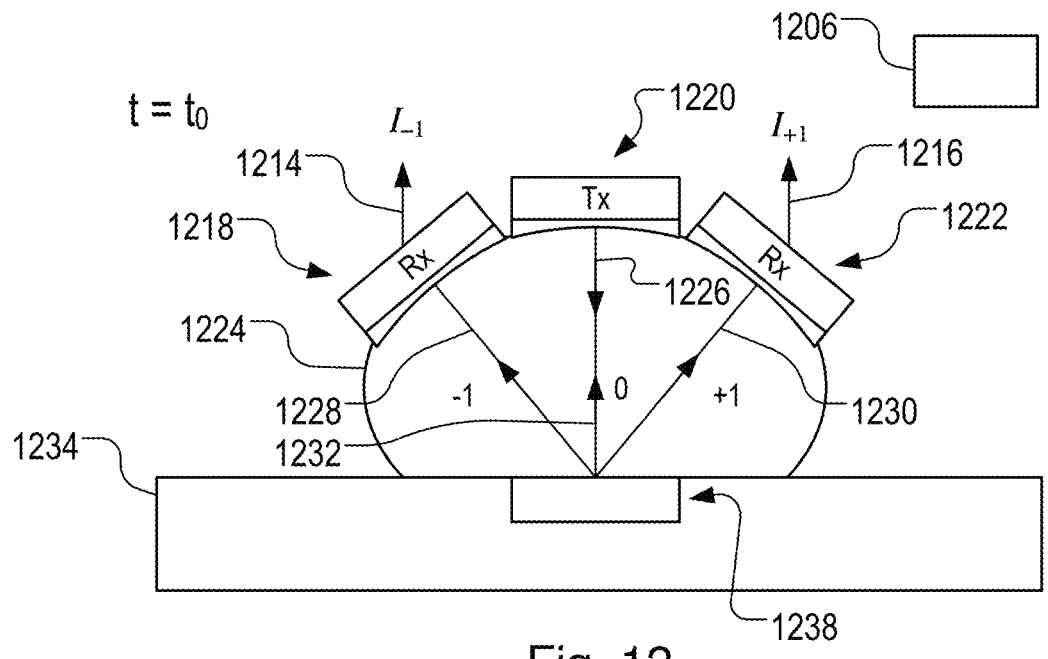
FIG. 12 depicts, in schematic form, an acoustic scatterometer with three acoustic transducers including a central acoustic source, in accordance with an embodiment of the present invention.

FIG. 12 depicts an acoustic scatterometer with three acoustic transducers and a central acoustic source. This is the same configuration as depicted in FIG. 5. It is reproduced here to depict the elements, which have the same reference numerals (beginning with 12), that are found in other examples depicted in FIGS. 13 to 16.

With reference to FIG. 12, the scatterometer has an acoustic source 1220 operable to project acoustic radiation 1226 onto a periodic structure 1238 formed on a substrate 1234. An acoustic detector 1218 is operable to detect the −1st acoustic diffraction order 1228 diffracted by the periodic structure 1238 while discriminating from specular reflection (0th order 1232). Another acoustic detector 1222 is operable to detect the +1st acoustic diffraction order 1230 diffracted by the periodic structure, again while discriminating from the specular reflection (0th order 1232). The acoustic source and acoustic detector may be piezo transducers as described with reference to FIG. 4.

The angle of incidence of the projected acoustic radiation 1226 and location of the detectors 1218 and 1222 are arranged with respect to the periodic structure 1238 such that the detection of the −1st and +1st acoustic diffraction orders 1228 and 1230 discriminates from the 0th order specular reflection 1232. The angle of incidence and positions may be determined by simulation and/or experimentation and depend on the pitch of the gratings and wavelength of the acoustic radiation.

A couplant system provides a couplant 1224 to facilitate transmission of the acoustic radiation between the acoustic source 1220 and the acoustic detectors 1218, 1222 via the periodic structure 1238.

The acoustic detector 1218 outputs an intensity signal $I_{-1}$ 1214 which is a measure of the −1st acoustic diffraction order 1228. The acoustic detector 1222 outputs an intensity signal $I_{+1}$ 1216 which is a measure of the +1st acoustic diffraction order 1230.

The output intensity signals $I_{-1}$ 1214 and $I_{+1}$ 1216 are received by a processing unit 1206, which operates in the same way as described with reference to processing unit 506 described with reference to FIG. 5.

Figure 13:
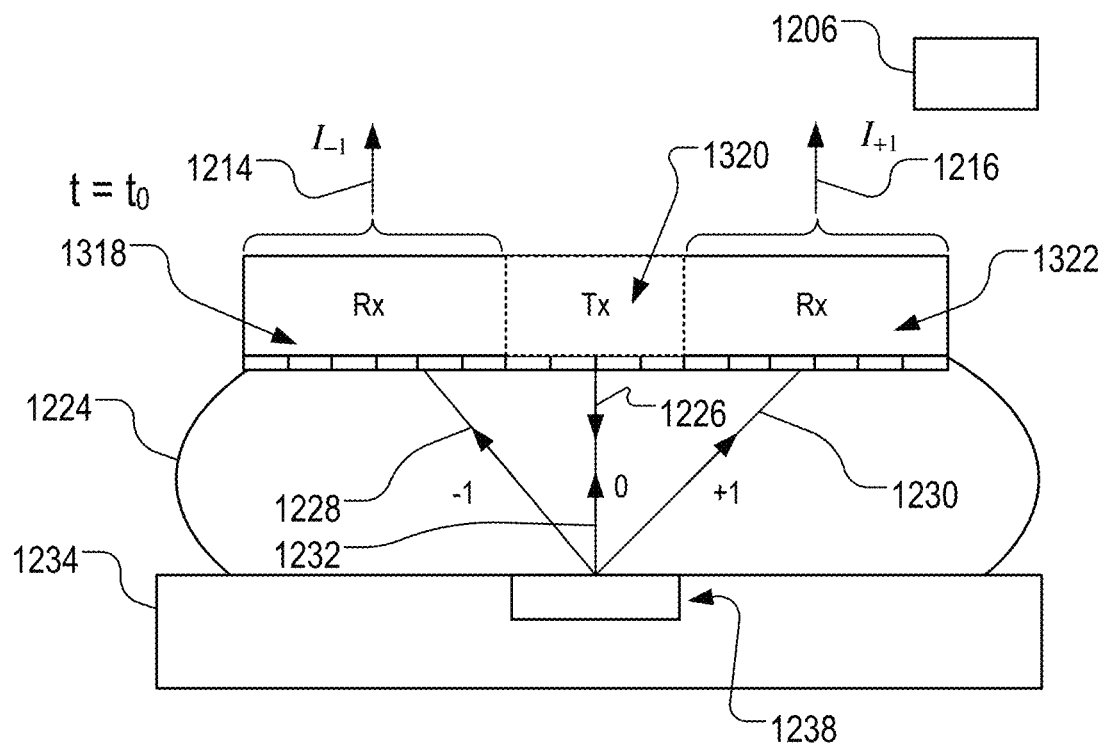
FIG. 13 depicts, in schematic form, an acoustic scatterometer implemented with a phased array of transducers, in accordance with an embodiment of the present invention.

FIG. 13 depicts an acoustic scatterometer implemented with a phased array of transducers. The sub-elements of the phased array are split into three groups 1318, 1320 and 1322, acting as a central acoustic source 1320 between a pair of acoustic detectors 1318 and 1322.

The operation is the same as described with reference to FIG. 12 for the elements with common reference numerals, with the following differences. Acoustic detector 1318 is arranged to receive an acoustic diffraction order 1228 diffracted by the periodic structure 1238. Acoustic detector 1322 is arranged to receive another acoustic diffraction order 1230 diffracted by the periodic structure that is opposite with respect to the acoustic diffraction order received by the first acoustic detector 1318.

Figure 14A:
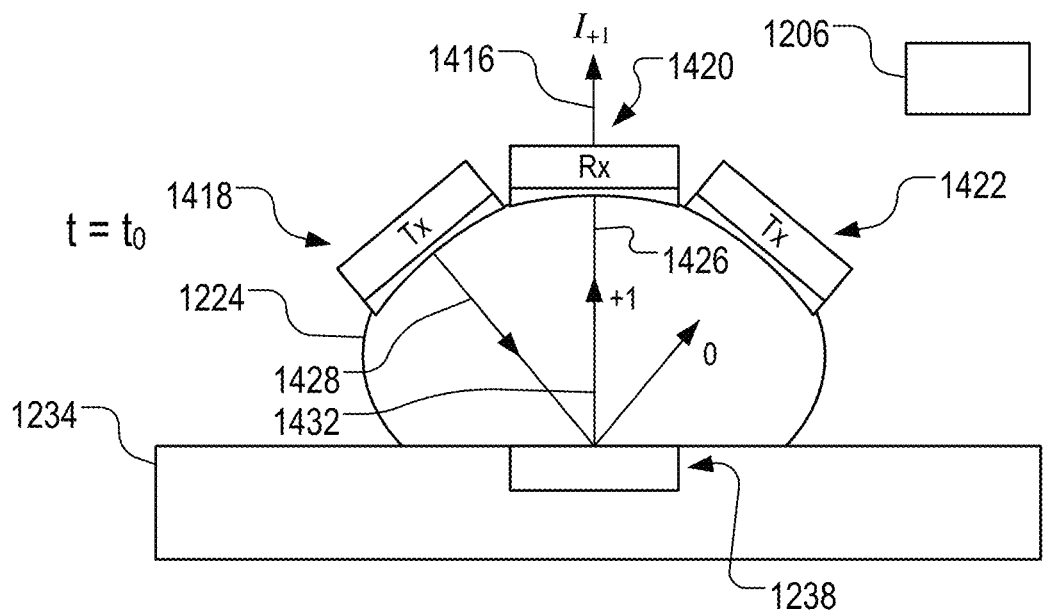
FIGS. 14a and 14b depict, in schematic form, an acoustic scatterometer with three acoustic transducers including a central acoustic detector, in accordance with an embodiment of the present invention.
Figure 14B:
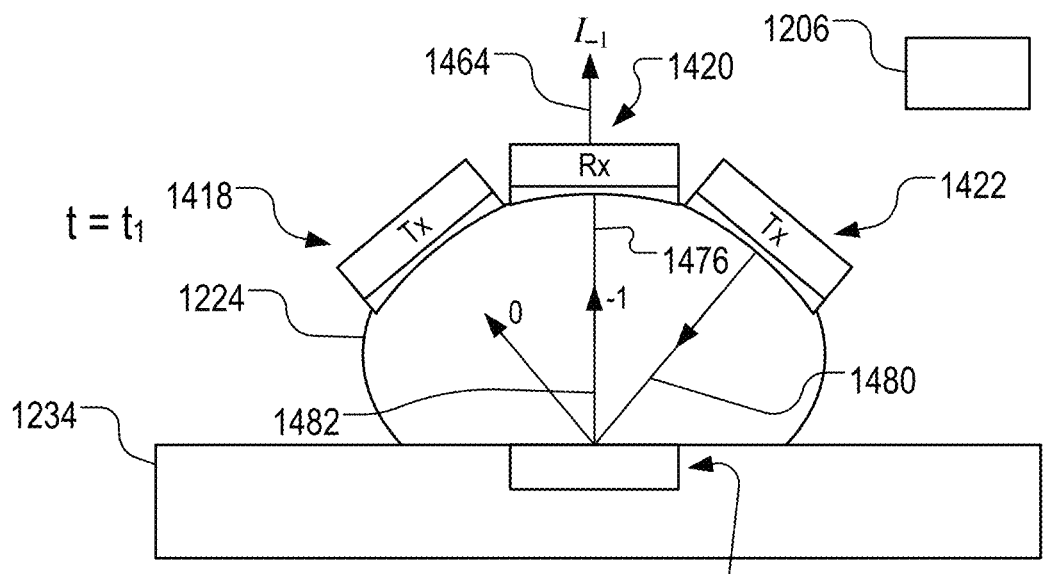

FIGS. 14*a* and 14*b* depict an acoustic scatterometer with three acoustic transducers. There are two acoustic sources 1418, 1422 and a central acoustic detector 1420. The operation is the same as described with reference to FIG. 12 for the elements with common reference numerals, with the following differences.

A first acoustic source 1418 is arranged to project (FIG. 14*a*) first acoustic radiation 1426 onto a periodic structure 1238 with a first angle of incidence. A second acoustic source 1422 is arranged to project (FIG. 14*b*) second acoustic radiation 1480 onto a periodic structure 1238 with a second angle of incidence.

In some examples (not shown) the first and second angles of incidence need not be equal. A detector with a wide acceptance angle may be used, or even separate detectors to detect diffraction orders from the first and second acoustic sources. Thus there may be four or more transducers, for example two acoustic sources and two acting as acoustic detectors.

In this example, the first and second acoustic sources are configurable to project their acoustic radiation at different times $t=t_0$ (FIG. 14*a*) and $t=t_1$ (FIG. 14*b*). The acoustic radiation is projected at the different times with first and second angles of incidence selected such that an acoustic detector 1420 is configurable to separately detect +1st (FIG. 14*a*) and −1st (FIG. 14*b*) acoustic diffraction orders.

In FIG. 14*a*, the acoustic detector 1420 is configured to detect the +1st diffraction order 1426, which has been diffracted by the periodic structure 1238 and arising from irradiation 1428 by the first acoustic source 1418. The acoustic detector 1420 outputs an intensity signal $I_{+1}$ 1416 which is a measure of the +1st acoustic diffraction order 1426.

In FIG. 14*b*, the acoustic detector 1420 is configured to detect another acoustic diffraction order 1476, which has been diffracted by the periodic structure 1238 and arises from irradiation 1480 by the second acoustic source 1422. Diffraction order 1476 is opposite (−1st order) with respect to the acoustic diffraction order 1426 (+1st order) arising from irradiation 1428 by the first acoustic source 1418. The acoustic detector 1420 outputs an intensity signal $I_{-1}$ 1464 which is a measure of the −1st acoustic diffraction order 1476.

The output intensity signals $I_{-1}$ 1464 and $I_{+1}$ 1416 are received by a processing unit 1206, which operates in the same way as described with reference to processing unit 506 described with reference to FIG. 5.

The acoustic source in the examples depicted in FIGS. 5, 12, 13 and 14 are operable to project continuous wave acoustic radiation onto the periodic structure while the acoustic detector is operable to simultaneously detect the acoustic diffraction order diffracted by the periodic structure. This is allowed because the acoustic source and acoustic detector are not the same transducer.

Figure 15A:
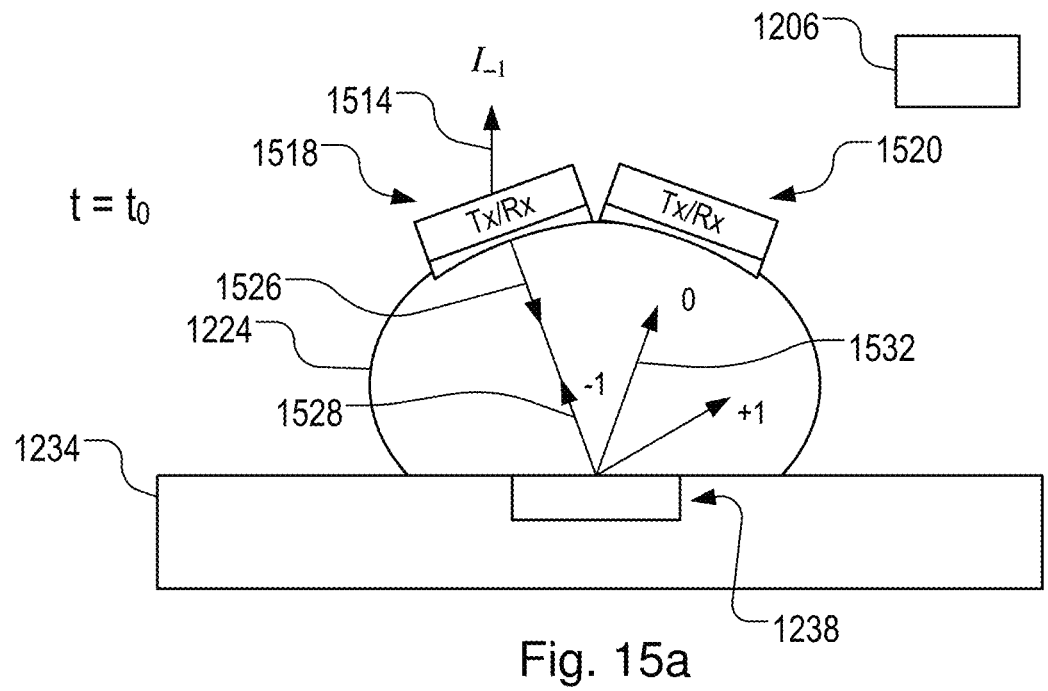
FIGS. 15a and 15b depict, in schematic form, an acoustic scatterometer with two transducers operating as transceivers, in accordance with an embodiment of the present invention.
Figure 15B:
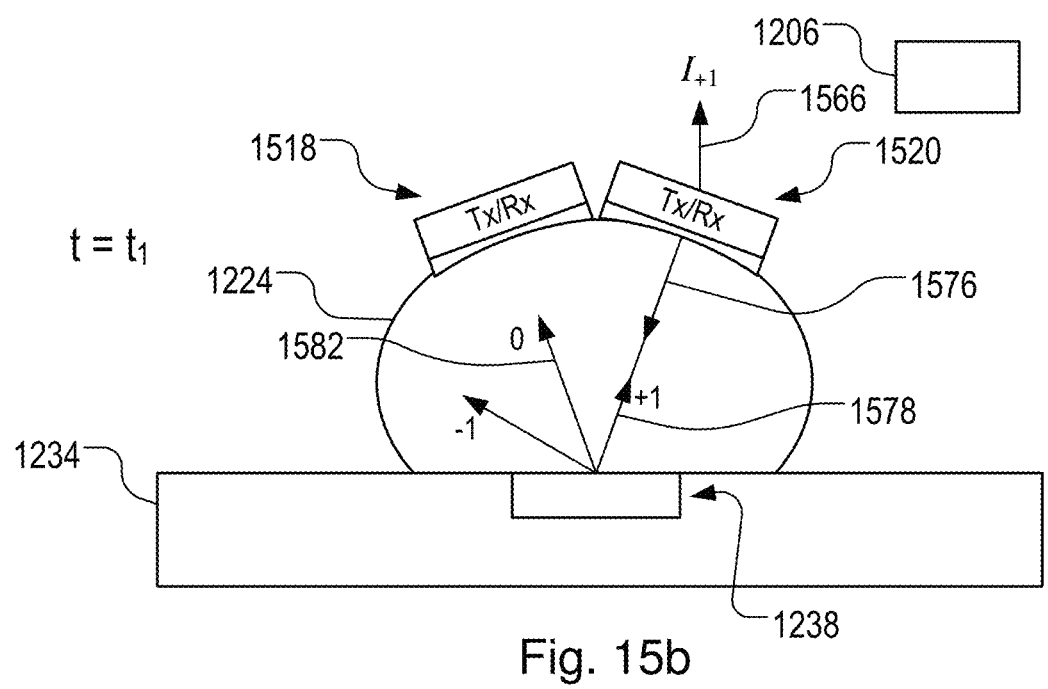

FIGS. 15*a* and 15*b* depict an acoustic scatterometer with two transducers operating as transceivers. The operation is the same as described with reference to FIG. 12 for the elements with common reference numerals, with the following differences. An acoustic transceiver 1518 is configurable as the acoustic source (in FIG. 15*a*) to project pulsed acoustic radiation 1526 and configurable as the acoustic detector (in FIG. 15*a*) to detect a backscattered acoustic diffraction order 1528 diffracted by the periodic structure 1238 and arising from the pulsed acoustic irradiation 1526. The acoustic transceiver 1518 outputs an intensity signal $I_{-1}$ 1514 which is a measurement of the −1st acoustic diffraction order 1528.

In this example with a pair of transceivers, the other acoustic transceiver 1520 is configurable as the acoustic source (in FIG. 15*b*) to project pulsed acoustic radiation 1576 and configurable as the acoustic detector (in FIG. 15*b*) to detect a backscattered acoustic diffraction order 1578 diffracted by the periodic structure 1238 and arising from the pulsed acoustic irradiation 1576. The acoustic transceiver 1520 outputs an intensity signal $I_{+1}$ 1566 which is a measurement of the +1st acoustic diffraction order 1578.

In this example, the acoustic transceivers 1518 and 1520 are configurable to project their acoustic radiation at different times $t=t_0$ (FIG. 15*a*) and $t=t_1$ (FIG. 15*b*), so that the backscattered acoustic diffraction order at a transceiver can be discriminated from the specular reflection arising from the irradiation 1532, 1582 by the other transceiver.

The output intensity signals $I_{-1}$ 1514 and $I_{+1}$ 1566 are received sequentially by a processing unit 1206, which operates in the same way as described with reference to processing unit 506 described with reference to FIG. 5.

Figure 16A:
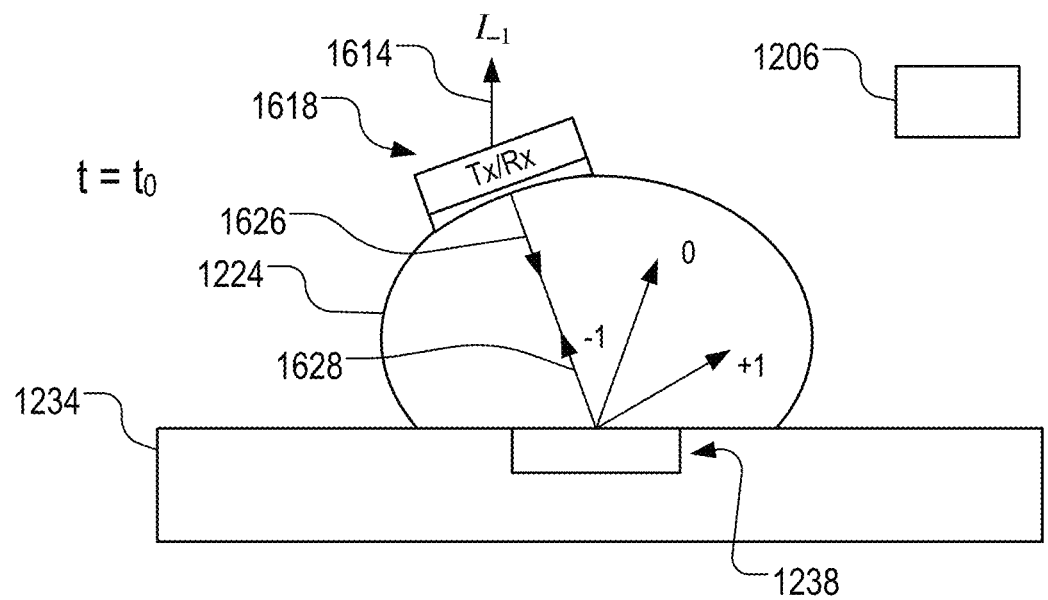
FIGS. 16a and 16b depict, in schematic form, an acoustic scatterometer with one transducer operating as a transceiver, in accordance with an embodiment of the present invention.
Figure 16B:
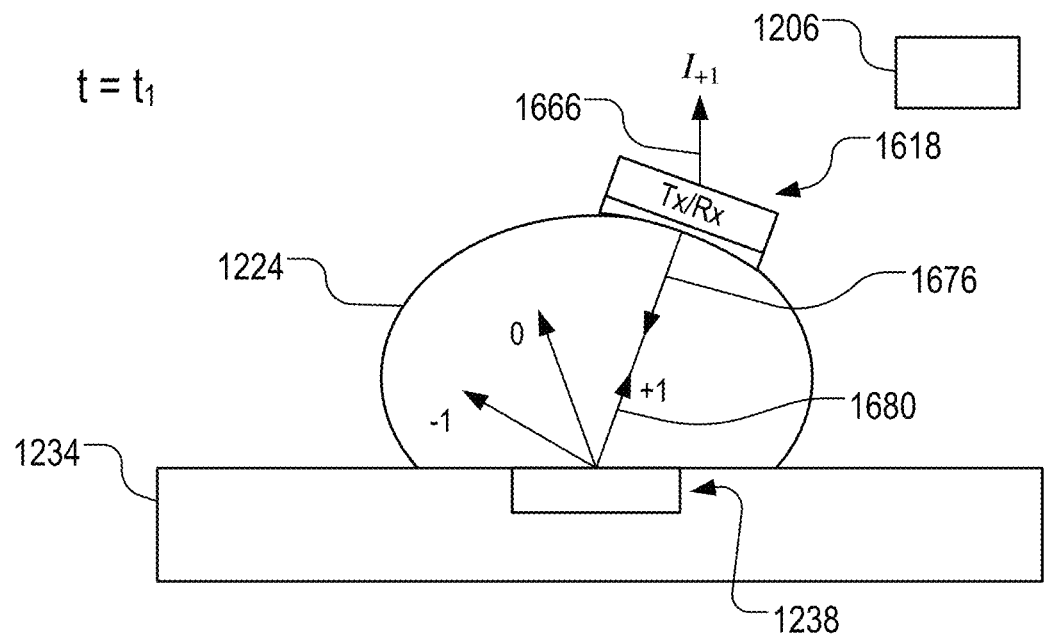

FIGS. 16*a* and 16*b* depict an acoustic scatterometer with one transducer operating as a transceiver. The operation is the same as described with reference to FIG. 12 for the elements with common reference numerals, with the following differences. An acoustic transceiver 1618 is configurable as the acoustic source (in FIG. 16*a*) to project pulsed acoustic radiation 1626 and configurable as the acoustic detector (in FIG. 16*a*) to detect a backscattered acoustic diffraction order 1628 diffracted by the periodic structure 1238 and arising from the pulsed acoustic irradiation 1626. The acoustic transceiver 1618 outputs an intensity signal $I_{-1}$ 1614 which is a measurement of the −1st acoustic diffraction order 1628.

In this example with a single transceivers, the periodic structure or the detector are rotated by 180 degrees around the direction perpendicular to the direction of periodicity of the periodic structure between measurement of the opposing acoustic diffraction orders. Alternatively, the transceiver may be simply moved along another path and redirected at the target. After the rotation or movement, the transceiver 1618 is configurable as the acoustic source (in FIG. 16*b*) to project pulsed acoustic radiation 1676 and configurable as the acoustic detector (in FIG. 16*b*) to detect a backscattered acoustic diffraction order 1680 diffracted by the periodic structure 1238 and arising from the pulsed acoustic irradiation 1676. The acoustic transceiver 1618 outputs an intensity signal $I_{+1}$ 1666 which is a measurement of the +1st acoustic diffraction order 1680.

The output intensity signals $I_{-1}$ 1614 and $I_{+1}$ 1666 are received sequentially by a processing unit 1206, which operates in the same way as described with reference to processing unit 506 described with reference to FIG. 5.

Figure 17:
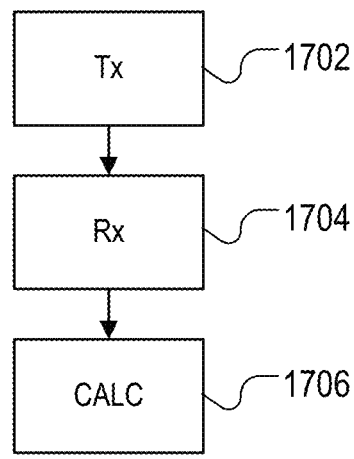
FIG. 17 depicts a method in accordance with an embodiment of the present invention.

FIG. 17 depicts a method of scatterometry. This method may be implemented using the scatterometers described with reference to FIGS. 5, 12 and 13.

With reference to FIG. 17, a method of scatterometry comprises:

1702 (Tx): projecting acoustic radiation onto a periodic structure formed on a substrate;

1704 (Rx): detecting an acoustic diffraction order diffracted by the periodic structure while discriminating from specular reflection; and 1706 (CALC): determining a property of the substrate based on the detected acoustic diffraction order.

The angle of incidence of the projected acoustic radiation and location of the detector with respect to the periodic structure are arranged such that the detection of the acoustic diffraction order discriminates from specular reflection. A couplant is provided to facilitate transmission of the acoustic radiation between the acoustic source and the acoustic detector via the periodic structure.

The property of the substrate may be determined based on at least one of amplitude, phase and direction of one or more detected acoustic diffraction order. The property of the substrate may comprise a physical property of the periodic structure.

The method may comprising determining a structural asymmetry of the periodic structure based on asymmetry of at least two corresponding opposite detected acoustic diffraction orders diffracted by the periodic structure.

The periodic structure may comprise a grating overlaid over another grating and the method may comprise determining an overlay error based on asymmetry of at least two corresponding opposite detected acoustic diffraction orders diffracted by the gratings.

The overlay error may be determined based on asymmetry of at least one of amplitude, phase and direction of the at least two corresponding opposite detected acoustic diffraction orders diffracted by the gratings.

Figure 18:
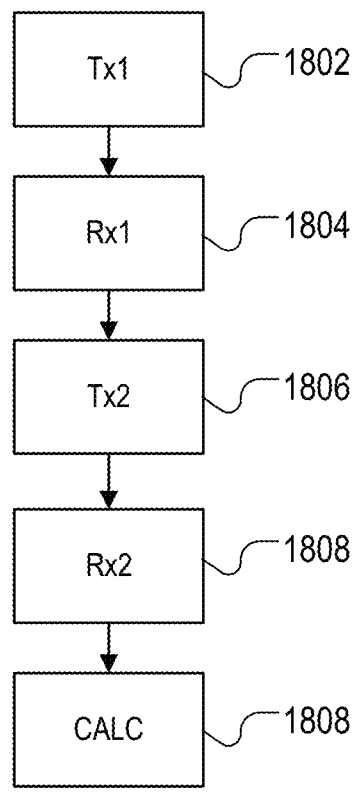
FIG. 18 depicts a method including projecting acoustic radiation at different times and with first and second angles of incidence, in accordance with an embodiment of the present invention.

FIG. 18 depicts a method including projecting acoustic radiation at different times and with first and second angles of incidence, in accordance with an embodiment of the present invention. This method may be implemented using the scatterometers described with reference to FIGS. 14 to 16, and could even be implemented using the scatterometers described with reference to FIGS. 5, 12 and 13.

With reference to FIG. 18, acoustic radiation may be projected at different times 1802 (Tx1), 1806 (Tx2) and with respective first and second angles of incidence selected to separately detect:

1804 (Rx1): an acoustic diffraction order (e.g. +1) diffracted by the periodic structure and arising from irradiation at the first angle of incidence; and 1808 (Rx2): another acoustic diffraction order (e.g. −1) diffracted by the periodic structure that is opposite with respect to the acoustic diffraction order (e.g. +1) arising from irradiation at the first angle of incidence.

At step 1808 (CALC) a property of the substrate is determined based on the detected acoustic diffraction order.

The methods of FIGS. 17 and 18 may comprise projecting continuous wave acoustic radiation onto the periodic structure while detecting the acoustic diffraction order diffracted by the periodic structure.

The methods of FIGS. 17 and 18 may comprise projecting pulsed acoustic radiation and detecting a backscattered acoustic diffraction order diffracted by the periodic structure and arising from the projection of the pulsed acoustic irradiation.

Embodiments of the present invention provide a non-destructive and fast way to measure properties of periodic structures.

In a further embodiment of the present invention, a measurement of only the zeroth order or the specular reflected light may be used to provide a measurement of a parameter of interest, in particular a parameter of interest such as overlay. In an embodiment, an acoustic polarizing element may be used. An acoustic polarizing element may be a single transducer or a an array of 2D transducers. In an example, the transducer 1220 of FIG. 12 may polarize the acoustic radiation in one polarizing direction and the transducers 1218 or 1222 of FIG. 12 may comprise an acoustic polarizing element in a direction orthogonal to the polarizing direction of transducer 1220. Such a setup is called a cross polarizing setup. When zeroth order radiation or specular radiation is used in a cross polarizing setup, a measurement of parameter of interest representative of product structures on a wafer may be measured.

Scatterometry using zeroth order electromagnetic radiation is known in the art. A parameter of interest of a lithographic process, such as overlay, may be measured by observing the asymmetry formed in the asymmetric pupil. If acoustic radiation is used, the principle of measurement remains the same, although the components involved in forming the overlay signal are different, as the physics of the acoustic radiation and the scattering thereof is different from the physics of electromagnetic radiation and the scattering thereof. For an acoustic setup, such as the one depicted in FIG. 12 for example, the acoustic Jones matrix may be expressed as $$J_{AB} = \begin{pmatrix} R_{PP} & R_{PH} & R_{PV} \\ R_{HP} & R_{HH} & R_{HV} \\ R_{VP} & R_{VH} & R_{VV} \end{pmatrix}$$

wherein the left side is the acoustic Jones matrix and the components of the right hand matrix are the reflection coefficients for an incident radiation with a polarization direction and outgoing radiation with a different or the same polarization direction of the acoustic radiation. In the case of acoustic radiation, the light may be polarized along the shear or compression waves direction. Thus, for acoustic metrology, one needs to consider shear polarized radiation or compression polarized radiation. The principle of measurement overlay with electromagnetic radiation apply also to the measurement of overlay with acoustic radiation, with the difference that, in the acoustic metrology setup one needs to consider 3 polarization direction, and the combination thereof, as opposed to the case of electromagnetic radiation, wherein only 2 polarization directions are needed. The setup for acoustic metrology described in previous embodiments is also applicable for measurements in an acoustic cross polarizing setup with the difference that zeroth order of the acoustic radiation is detected and not the diffracted orders of the acoustic radiation. Acoustic polarized radiation may be created with known methods, as state of the art comprises solutions to forming both shearing and compressing polarized acoustic radiation.

Scatterometers in accordance with embodiments of the present invention may be used where optical scatterometers are not suitable. Alternatively, scatterometers in accordance with embodiments of the present invention may be used to complement an optical scatterometer in an inspection apparatus.

Although specific reference may be made in this text to the use of lithographic apparatus in the manufacture of ICs, it should be understood that the scatterometer described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a wafer inspection apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools.

Although specific reference may have been made above to the use of embodiments of the invention in the context of optical lithography, it will be appreciated that the invention, where the context allows, is not limited to optical lithography and may be used in other applications, for example imprint lithography.

Further embodiments according to the invention are further described in below numbered clauses:

1. A scatterometer comprising:
   an acoustic source operable to project acoustic radiation onto a periodic structure formed on a substrate; and
   an acoustic detector operable to detect an acoustic diffraction order diffracted by the periodic structure while discriminating from specular reflection,
   wherein the scatterometer is operable to determine a property of the substrate based on the detected acoustic diffraction order.

2. The scatterometer of clause 1 wherein the angle of incidence of the projected acoustic radiation and location of the detector are arranged with respect to the periodic structure such that the detection of the acoustic diffraction order discriminates from specular reflection.

3. The scatterometer of clause 1 or clause 2 further comprising a couplant system to provide a couplant to facilitate transmission of the acoustic radiation between the acoustic source and the acoustic detector via the periodic structure.

4. The scatterometer of any preceding clause wherein the scatterometer is operable to determine the property of the substrate based on at least one of amplitude, phase and direction of one or more detected acoustic diffraction order.

5. The scatterometer of any preceding clause wherein the property of the substrate comprises a physical property of the periodic structure.

6. The scatterometer of any preceding clause wherein the scatterometer is operable to determine a structural asymmetry of the periodic structure based on asymmetry of at least two corresponding opposite detected acoustic diffraction orders diffracted by the periodic structure.

7. The scatterometer of any preceding clause wherein the periodic structure comprises a grating overlaid over another grating and the scatterometer is operable to determine an overlay error based on asymmetry of at least two corresponding opposite detected acoustic diffraction orders diffracted by the gratings.

8. The scatterometer of clause 7 wherein the overlay error is determined based on asymmetry of at least one of amplitude, phase and direction of the at least two corresponding opposite detected acoustic diffraction orders diffracted by the gratings.

9. The scatterometer of any preceding clause comprising:
   a first acoustic detector arranged to receive an acoustic diffraction order diffracted by the periodic structure; and
   a second acoustic detector arranged to receive another acoustic diffraction order diffracted by the periodic structure that is opposite with respect to the acoustic diffraction order received by the first acoustic detector.

10. The scatterometer of any of preceding clause comprising:
    a first acoustic source arranged to project first acoustic radiation onto a periodic structure with a first angle of incidence; and
    a second acoustic source arranged to project second acoustic radiation onto a periodic structure with a second angle of incidence.

11. The scatterometer of clause 10 wherein the first and second acoustic sources are configurable to project their acoustic radiation at different times and with first and second angles of incidence selected such that an acoustic detector is configurable to separately detect:
    an acoustic diffraction order diffracted by the periodic structure and arising from irradiation by the first acoustic source; and
    another acoustic diffraction order diffracted by the periodic structure that is opposite with respect to the acoustic diffraction order arising from irradiation by the first acoustic source.

12. The scatterometer of any preceding clause, wherein the acoustic source is operable to project continuous wave acoustic radiation onto the periodic structure while the acoustic detector is operable to detect the acoustic diffraction order diffracted by the periodic structure.

13. The scatterometer of any of clauses 1 to 11 comprising an acoustic transceiver configurable as the acoustic source to project pulsed acoustic radiation and configurable as the acoustic detector to detect a backscattered acoustic diffraction order diffracted by the periodic structure and arising from the pulsed acoustic irradiation.

14. A method of scatterometry comprising:
    projecting acoustic radiation onto a periodic structure formed on a substrate;
    detecting an acoustic diffraction order diffracted by the periodic structure while discriminating from specular reflection; and
    determining a property of the substrate based on the detected acoustic diffraction order.

15. The method of clause 14 comprising arranging the angle of incidence of the projected acoustic radiation and location of the detector with respect to the periodic structure such that the detection of the acoustic diffraction order discriminates from specular reflection.

16. The method of clause 14 or clause 15 further comprising providing a couplant to facilitate transmission of the acoustic radiation between the acoustic source and the acoustic detector via the periodic structure.

17. The method of any of clauses 14 to 16 comprising determining the property of the substrate based on at least one of amplitude, phase and direction of one or more detected acoustic diffraction order.

18. The method of any of clauses 14 to 17 wherein the property of the substrate comprises a physical property of the periodic structure.

19. The method of any of clauses 14 to 18 comprising determining a structural asymmetry of the periodic structure based on asymmetry of at least two corresponding opposite detected acoustic diffraction orders diffracted by the periodic structure.

20. The method of any of clauses 14 to 19 wherein the periodic structure comprises a grating overlaid over another grating and the method comprises determining an overlay error based on asymmetry of at least two corresponding opposite detected acoustic diffraction orders diffracted by the gratings.

21. The method of clause 20 comprising determining the overlay error based on asymmetry of at least one of amplitude, phase and direction of the at least two corresponding opposite detected acoustic diffraction orders diffracted by the gratings.

22. The method of any of clauses 14 to 21 comprising projecting acoustic radiation at different times and with first and second angles of incidence selected to separately detect:
  an acoustic diffraction order diffracted by the periodic structure and arising from irradiation at the first angle of incidence; and
  another acoustic diffraction order diffracted by the periodic structure that is opposite with respect to the acoustic diffraction order arising from irradiation at the first angle of incidence.

23. The method of any of clauses 14 to 21 comprising projecting continuous wave acoustic radiation onto the periodic structure while detecting the acoustic diffraction order diffracted by the periodic structure.

24. The method of any of clauses 14 to 22 comprising projecting pulsed acoustic radiation and detecting a backscattered acoustic diffraction order diffracted by the periodic structure and arising from the projection of the pulsed acoustic irradiation.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A scatterometer comprising:
  an acoustic source configured to project acoustic radiation at an angle of incidence onto a target formed on a substrate to produce first and second acoustic diffraction orders;
  a first acoustic detector configured to detect the first acoustic diffraction order while discriminating from spectral reflection and to produce a first detection signal; and
  a second acoustic detector configured to detect the second acoustic diffraction order while discriminating from spectral reflection and to produce a second detection signal,
  wherein the scatterometer is configured to determine a property of the substrate based on the first and second detection signals, and
  wherein the target comprises:
    a first periodic structure;
    a second periodic structure overlaying the first periodic structure; and
    a layer disposed between the first and second periodic structures.

2. The scatterometer of claim 1, wherein the layer transmits acoustic radiation but is opaque to optical radiation.

3. The scatterometer of claim 1, wherein the angle of incidence of the projected acoustic radiation and location of the first and second acoustic detectors are arranged with respect to the target such that the detection of the first and second acoustic diffraction orders discriminates from specular reflection.

4. The scatterometer of claim 1, further comprising a couplant configured to facilitate transmission of the acoustic radiation between the acoustic source and the first and second acoustic detectors via the target.

5. The scatterometer of claim 4, wherein the couplant comprises distilled water.

6. The scatterometer of claim 1, wherein the acoustic source and the first and second acoustic detectors comprise piezo transducers.

7. The scatterometer of claim 1, wherein the scatterometer is configured to determine the property of the substrate based on at least one of amplitude, phase, and direction of the first and second acoustic diffraction orders.

8. The scatterometer of claim 1, wherein the property of the substrate comprises a physical property of the target.

9. The scatterometer of claim 8, wherein the physical property comprises an overlay error.

10. The scatterometer of claim 1, wherein the scatterometer is configured to determine a structural asymmetry of the target based on asymmetry of the detected first and second acoustic diffraction orders diffracted by the target.

11. A scatterometer comprising:
  a first acoustic transceiver comprising:
    a first acoustic source configured to project first acoustic radiation at a first angle of incidence onto a target formed on a substrate to produce a first acoustic diffraction order; and
    a first acoustic detector configured to detect the first acoustic diffraction order while discriminating from spectral reflection and to produce a first detection signal; and
  a second acoustic transceiver comprising:
    a second acoustic source configured to project second acoustic radiation at a second angle of incidence onto the target to produce a second acoustic diffraction order; and
    a second acoustic detector configured to detect the second acoustic diffraction order while discriminating from spectral reflection and to produce a second detection signal,
  wherein the scatterometer is configured to determine a property of the substrate based on the first and second detection signals, and
  wherein the first and second acoustic transceivers are configured to project the first and second acoustic radiation at different times and with the first and second angles of incidence selected such that the first and second acoustic transceivers are configured to separately detect the first and second acoustic diffraction orders.

12. The scatterometer of claim 11, further comprising a processor configured to sequentially receive the first and second detection signals.

13. The scatterometer of claim 11, further comprising a couplant configured to facilitate transmission of the first and second acoustic radiation between the first and second acoustic transceivers via the target.

14. The scatterometer of claim 11, wherein the target comprises:
  a first periodic structure;
  a second periodic structure overlaying the first periodic structure; and
  a layer disposed between the first and second periodic structures.

15. The scatterometer of claim 11, wherein the property of the substrate comprises a physical property of the target.

16. A scatterometer comprising:
an acoustic transceiver comprising:
an acoustic source configured to project first acoustic radiation at a first angle of incidence onto a target formed on a substrate to produce a first acoustic diffraction order, and configured to project second acoustic radiation at a second angle of incidence onto the target to produce a second acoustic diffraction order; and
an acoustic detector configured to detect the first acoustic diffraction order while discriminating from spectral reflection and to produce a first detection signal, and configured to detect the second acoustic diffraction order while discriminating from spectral reflection and to produce a second detection signal,
wherein the scatterometer is configured to determine a property of the substrate based on the first and second detection signals, and
wherein the acoustic transceiver is configured to project the first and second acoustic radiation at different times and with the first and second angles of incidence selected such that the acoustic transceiver is configured to separately detect the first and second acoustic diffraction orders.

17. The scatterometer of claim 16, wherein the target or the acoustic transceiver is rotated by 180 degrees about an axis perpendicular to a direction of periodicity of the target in between the different times the first and second acoustic radiation are projected.

18. The scatterometer of claim 16, further comprising a processor configured to sequentially receive the first and second detection signals.

19. The scatterometer of claim 16, further comprising a couplant configured to facilitate transmission of the first and second acoustic radiation between the first and second acoustic transceivers via the target.

20. The scatterometer of claim 16, wherein the property of the substrate comprises a physical property of the target.

* * * * *